United States Patent
Park et al.

(10) Patent No.: US 9,570,670 B2
(45) Date of Patent: Feb. 14, 2017

(54) MAGNETIC DEVICE AND METHOD OF FABRICATING THE SAME

(71) Applicants: ChanJin Park, Yongin-si (KR); Woojin Kim, Yongin-si (KR); Hyungjoon Kwon, Seongnam-si (KR); Soonoh Park, Suwon-si (KR); Jongchul Park, Seongnam-si (KR); Sechung Oh, Suwon-si (KR)

(72) Inventors: ChanJin Park, Yongin-si (KR); Woojin Kim, Yongin-si (KR); Hyungjoon Kwon, Seongnam-si (KR); Soonoh Park, Suwon-si (KR); Jongchul Park, Seongnam-si (KR); Sechung Oh, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 13/763,464

(22) Filed: Feb. 8, 2013

(65) Prior Publication Data
US 2014/0021566 A1   Jan. 23, 2014

(30) Foreign Application Priority Data

Jul. 20, 2012  (KR) .................. 10-2012-0079269

(51) Int. Cl.
*H01L 43/02* (2006.01)
*H01L 43/08* (2006.01)
*H01L 43/12* (2006.01)

(52) U.S. Cl.
CPC ............... *H01L 43/02* (2013.01); *H01L 43/08* (2013.01); *H01L 43/12* (2013.01)

(58) Field of Classification Search
CPC ........ H01L 43/08; H01L 43/12; H01L 27/222; B82Y 25/00; H01F 10/3254; G11C 11/16
USPC ........................................... 257/447; 348/294
See application file for complete search history.

(56) References Cited

U.S. PATENT DOCUMENTS

| | | | |
|---|---|---|---|
| 7,527,986 B1 | 5/2009 | Jung | |
| 8,183,061 B2 | 5/2012 | Zhong et al. | |
| 2005/0009212 A1* | 1/2005 | Grynkewich et al. | 438/3 |
| 2005/0052938 A1* | 3/2005 | Horikoshi | 365/232 |
| 2006/0132984 A1* | 6/2006 | Kajiyama et al. | 360/317 |
| 2006/0145226 A1* | 7/2006 | Boivin | H01L 43/12 257/295 |
| 2009/0256220 A1* | 10/2009 | Horng | H01L 43/08 257/421 |
| 2010/0003767 A1 | 1/2010 | Cho | |
| 2010/0193888 A1 | 8/2010 | Gu et al. | |
| 2010/0240189 A1* | 9/2010 | Jeong et al. | 438/385 |

(Continued)

FOREIGN PATENT DOCUMENTS

| | | |
|---|---|---|
| JP | 2002-111096 A | 4/2002 |
| JP | 2008-226919 | 9/2008 |

(Continued)

*Primary Examiner* — Jerome Jackson, Jr.
(74) *Attorney, Agent, or Firm* — Renaissance IP Law Group LLP

(57) ABSTRACT

Provided are a magnetic memory device and a method of fabricating the same. The device may include a magnetic tunnel junction including a lower magnetic structure, an upper magnetic structure, and a tunnel barrier interposed therebetween. The tunnel barrier may have a width greater than that of the lower magnetic structure.

23 Claims, 32 Drawing Sheets

(56) References Cited

U.S. PATENT DOCUMENTS

| | | | |
|---|---|---|---|
| 2010/0301480 A1* | 12/2010 | Choi et al. ................... 257/751 |
| 2011/0008915 A1* | 1/2011 | Nozieres ................. G11C 11/16 |
| | | | 438/3 |
| 2011/0117677 A1 | 5/2011 | Yuan et al. |
| 2011/0233696 A1 | 9/2011 | Li et al. |
| 2011/0272770 A1 | 11/2011 | Hatada |
| 2012/0135544 A1* | 5/2012 | Kim ...................... C23C 16/345 |
| | | | 438/3 |
| 2013/0099335 A1* | 4/2013 | Chi ......................... H01L 43/08 |
| | | | 257/421 |

FOREIGN PATENT DOCUMENTS

| KR | 1020100018814 B1 | 2/2010 |
| KR | 1020100053856 A | 5/2010 |

* cited by examiner

30

30

MAGNETIC DEVICE AND METHOD OF FABRICATING THE SAME

CROSS-REFERENCE TO RELATED APPLICATIONS

This U.S. non-provisional patent application claims priority under 35 U.S.C. §119 to Korean Patent Application No. 10-2012-0079269 filed on Jul. 20, 2012, in the Korean Intellectual Property Office, the entire contents of which are hereby incorporated by reference.

BACKGROUND

Various embodiments of the inventive concepts relate to a semiconductor device, and in particular, to a magnetic device and a method of fabricating the same.

With increasing use of portable computing devices and wireless communication devices, semiconductor devices may require higher density, lower power, and/or nonvolatile properties. Magnetic devices may be able to satisfy the aforementioned technical requirements.

A magnetic memory device utilizes a tunnel magneto resistance (TMR) effect of a magnetic tunnel junction (MTJ) element for storing data. An MTJ element having a high TMR ratio of, for example, several hundred to several thousand percent, may be desirable.

SUMMARY

Embodiments of the inventive concepts provide a magnetic device with improved reliability and dispersion properties.

In one embodiment, a magnetic device comprises a magnetic tunnel junction including a lower magnetic structure, a tunnel barrier, and an upper magnetic structure, which are sequentially stacked. The tunnel barrier may have a width greater than that of the lower magnetic structure. The tunnel barrier may have a substantially quadrilateral cross section. In another embodiment, a magnetic device comprises a magnetic tunnel junction including: a first magnetic layer; a non-magnetic spacer layer arranged adjacent the first magnetic layer; and a second magnetic layer adjacent the non-magnetic spacer layer. At least one of the first magnetic layer or the second magnetic layer has a generally U-shape in cross-sectional view. The non-magnetic spacer layer may extend in a substantially straight line in cross-sectional view.

BRIEF DESCRIPTION OF THE DRAWINGS

Example embodiments will be more clearly understood from the following brief description taken in conjunction with the accompanying drawings. FIGS. 1 through 37 represent non-limiting, example embodiments as described herein.

FIG. 1 is a schematic circuit diagram of a unit cell of a magnetic memory device according to example embodiments of the inventive concept.

FIGS. 2 through 6 are circuit diagrams exemplarily illustrating selection devices according to example embodiments of the inventive concept.

FIG. 7 is a diagram schematically illustrating a first type of MTJ according to example embodiments of the inventive concept.

FIG. 8 is a diagram schematically illustrating a second type of MTJ according to example embodiments of the inventive concept.

FIG. 9 is a flow chart illustrating a method of fabricating a magnetic tunnel junction of a magnetic memory device, according to example embodiments of the inventive concept.

FIGS. 10 through 15 are cross-sectional views illustrating a method of fabricating a magnetic tunnel junction of a magnetic memory device, according to example embodiments of the inventive concept.

FIGS. 16 through 18 are cross-sectional views illustrating a damascene process, which may be used in a process of forming a magnetic tunnel junction according to example embodiments of the inventive concept.

FIGS. 19 through 22 are cross-sectional views illustrating a patterning process, which may be used in a process of forming a magnetic tunnel junction according to example embodiments of the inventive concept.

FIGS. 23 and 24 are cross-sectional views schematically illustrating structural features of multilayered patterns formed by the damascene and patterning processes, respectively.

FIGS. 25 through 28 are sectional views illustrating magnetic tunnel junctions according to example embodiments of the inventive concept.

FIG. 29 is a cross-sectional view provided to exemplarily explain one aspect of structural features of a magnetic tunnel junction.

FIGS. 30 through 32 are cross-sectional views illustrating examples of a tunnel bather in a magnetic tunnel junction according to example embodiments of the inventive concept.

FIG. 33 is a cross-sectional view exemplarily and schematically illustrating a magnetic structure formed by the damascene process.

FIG. 35 is a cross-sectional view illustrating a method of fabricating a magnetic tunnel junction according to modified example embodiments of the inventive concept.

FIG. 37 is a schematic circuit diagram of a unit cell of a magnetic memory device according to modified embodiments of the inventive concept.

Figure 1:
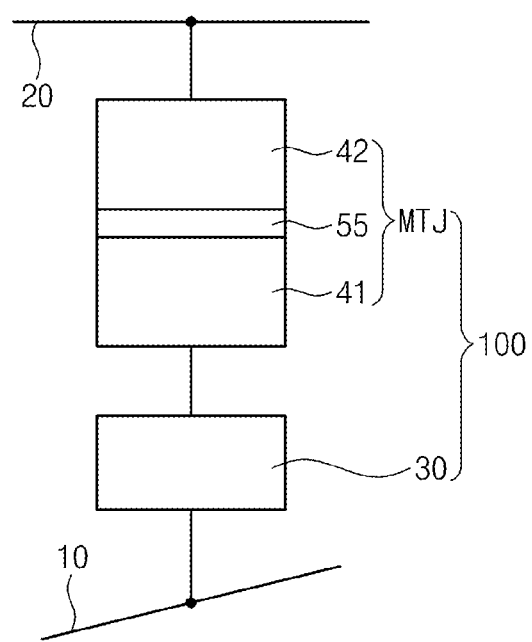
Figure 2:
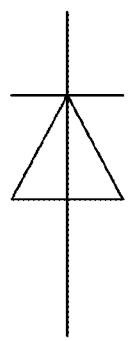
Figure 3:
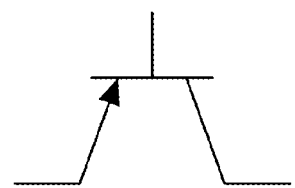
Figure 4:
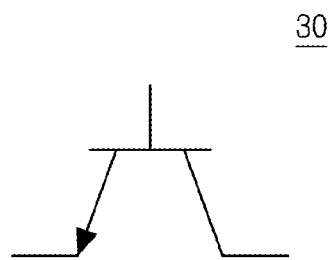
Figure 5:
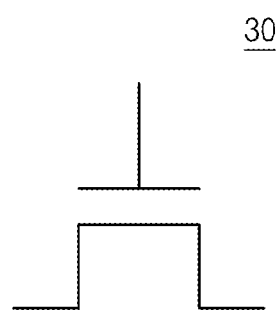
Figure 6:
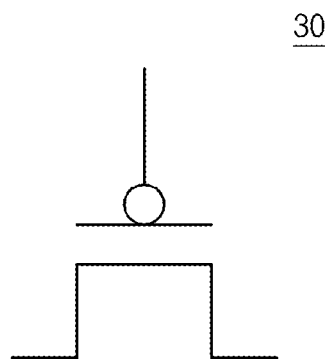

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings. The inventive concepts may, however, be embodied in many different forms and should not be construed as being limited to the specific embodiments set forth herein. Rather, the example embodiments are supplied to provide a thorough and complete disclosure, and to fully convey the inventive concepts to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a schematic circuit diagram exemplarily illustrating a unit cell of a magnetic memory device according to an example embodiment.

Referring to FIG. 1, a unit cell 100 may be disposed between first and second interconnection lines 10 and 20, which cross each other (not shown). The unit cell 100 may be connected in series to the first and second interconnection lines 10 and 20. The unit cell 100 may include a selection element 30 and a magnetic tunnel junction (MTJ). The selection element 30 and the MTJ may be electrically connected in series to each other. One of the first and second interconnection lines 10 and 20 may, for example, be used as a word line, and the other may be used as a bit line.

The selection element 30 may be configured to selectively control an electric current passing through the MTJ. For example, as shown in FIGS. 2 through 6, the selection element 30 may be a diode, a pnp bipolar transistor, an npn bipolar transistor, an NMOS field effect transistor (FET), or a PMOS FET. If the selection element 30 is a three-terminal switching device, such as a bipolar transistor and/or MOSFET, an additional interconnection line (not shown) may be connected to the selection element 30.

Figure 7:
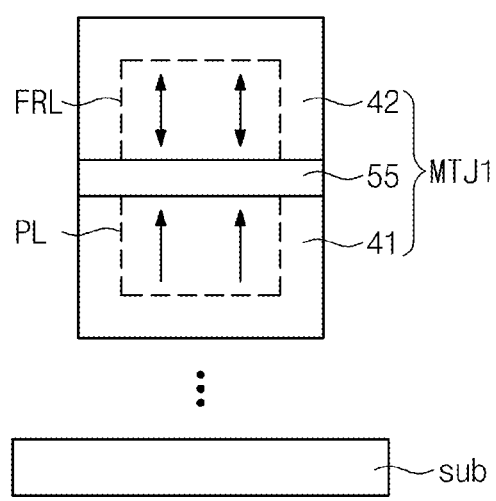
Figure 8:
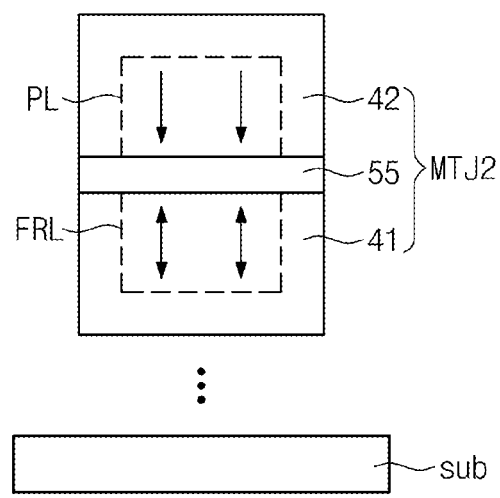

The MTJ may include a lower magnetic structure 41, an upper magnetic structure 42, and a tunnel barrier 55 therebetween. Each of the lower and upper magnetic structures 41 and 42 may include at least one magnetic layer formed of a magnetic material such as a ferromagnetic material. One of the magnetic layers may be configured to have a fixed magnetization direction, which does not change in response to an external magnetic field generated under usual circumstances. Hereinafter, for convenience in description, the term 'pinned layer PL' will be used to refer to the magnetic layer having fixed magnetization. By contrast, the other of the magnetic layers may be configured to have a magnetization direction that is switchable in response to an external magnetic field or spin-polarized current applied thereto. Hereinafter, the term 'free layer FRL' will be used to refer to the magnetic layer having a switchable magnetization direction. That is, as shown in FIGS. 7 and 8, the MTJ may include at least one free layer FRL and at least one pinned layer PL, which are separated by the tunnel barrier 55. According to the present disclosure, the MTJ is configured such that the free layer is switchable between a plurality of stable magnetic states when a write current is passed through the MTJ.

Electrical resistance of the MTJ may be sensitive to a relative orientation of magnetization directions of the free and pinned layers FRL and PL. For example, the electrical resistance of the MTJ may be far greater when the relative orientation is anti-parallel than when parallel. This means that the electrical resistance of the magnetic tunnel junction MTJ may be controlled by changing the magnetization direction of the free layer FRL. The magnetic memory devices according to example embodiments of the inventive concept may be realized based on this data storing mechanism, i.e., a spin torque transfer (STT) effect.

As shown in FIGS. 7 and 8, the lower and upper magnetic structures 41 and 42 of the MTJ may be sequentially formed on a substrate SUB. In an example embodiment, according to a relative configuration between the free layer FRL and the substrate SUB or an order of forming the free layer FRL and the pinned layer PL, the magnetic tunnel junction MTJ may be classified, for example, into one of two types: (a) a first type of magnetic tunnel junction (MTJ1) configured in such a way that the lower and upper magnetic structures 41 and 42 include the pinned layer PL and the free layer FRL, respectively, as shown in FIG. 7, and (b) a second type of magnetic tunnel junction (MTJ2) configured in such a way that the lower and upper magnetic structures 41 and 42 include the free layer FRL and the pinned layer PL, respectively, as shown in FIG. 8.

Figure 9:
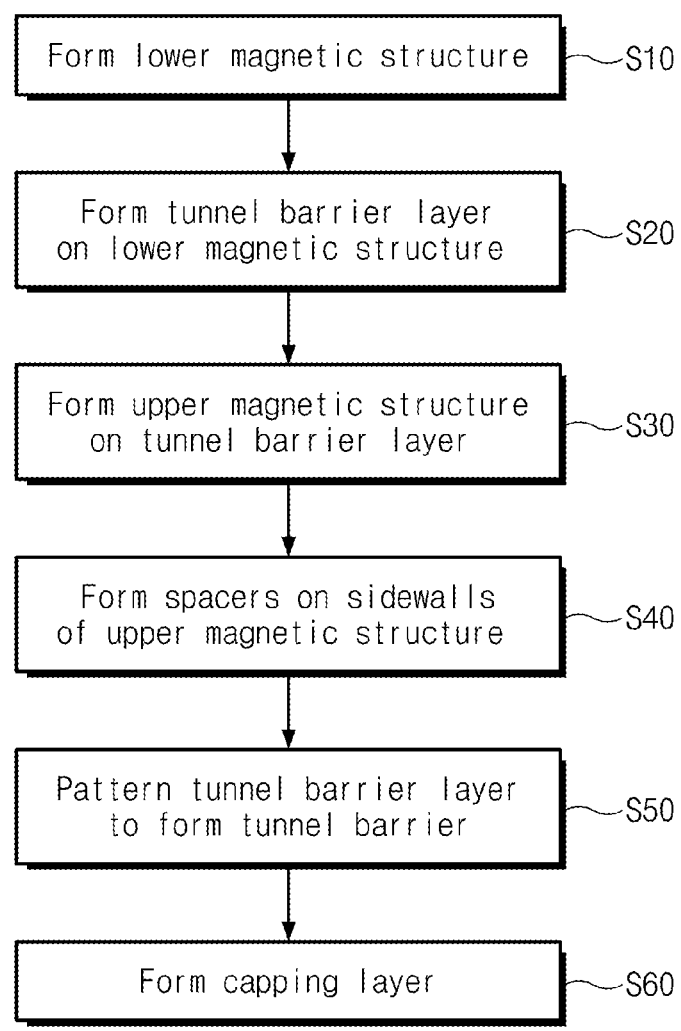

FIG. 9 is a flow chart illustrating a method of fabricating a MTJ element of a magnetic device, e.g., a magnetic memory device according to an example embodiment of the inventive concepts. FIGS. 10 through 15 are cross-sectional views illustrating a method of fabricating a MTJ of a magnetic device, according to an example embodiment of the inventive concepts.

Figure 10:
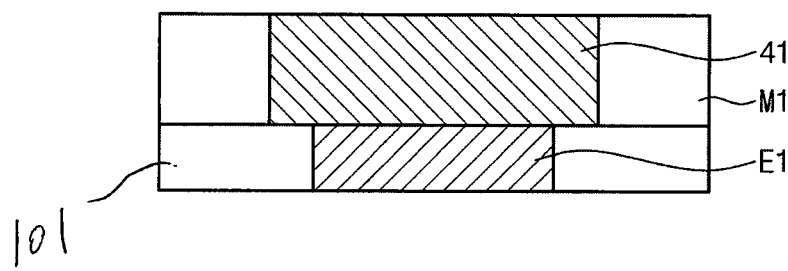

Referring to FIGS. 9 and 10, the lower magnetic structure 41 may be formed in one step (S10). The lower magnetic structure 41 may be formed in a predetermined region confined by a lower insulating layer M1, or, in other words, formed locally or selectively. For example, a first electrode E1 may be selectively formed on a predetermined region of the substrate SUB (not shown), and the lower magnetic structure 41 may be connected to the first electrode E1.

The lower magnetic structure 41 may include a plurality of metal-containing layers, at least one of which may be a magnetic layer. The localization or selective formation of the lower magnetic structure 41 will be described in more detail with reference to FIGS. 16 through 18.

Figure 11:
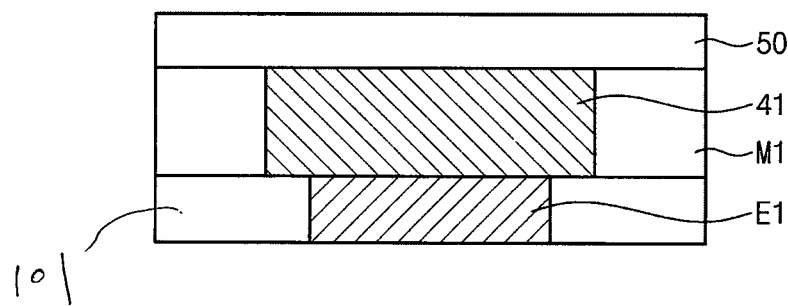

Referring to FIGS. 9 and 11, a nonmagnetic spacer layer such as a tunnel barrier layer 50 may be formed on the lower magnetic structure 41 in another step (S20). The tunnel barrier layer 50 may be formed to cover substantially the entire top surface of the resulting structure including the lower magnetic structure 41. The tunnel barrier layer 50 may include a plurality of layers, at least one of which may be an insulating layer, which may enhance the tunneling magnetoresistance (TMR) of the MTJ. Each of the layers constituting the tunnel barrier layer 50 may be formed using a deposition technique such as chemical vapor deposition (CVD) or atomic layer deposition (ALD).

In some embodiments, the nonmagnetic spacer layer may include a conductor, such as Cu to form a spin valve. In alternate embodiments, the nonmagnetic spacer layer might have another structure, for example, a granular layer including conductive channels in an insulating matrix.

According to an example embodiment of the inventive concepts, the lower magnetic structure 41 may be selectively formed on the substrate SUB, even before the formation of the tunnel barrier layer 50. In other words, the localization or selective formation of the lower magnetic structure 41 may be performed before forming the tunnel barrier layer 50.

Figure 12:
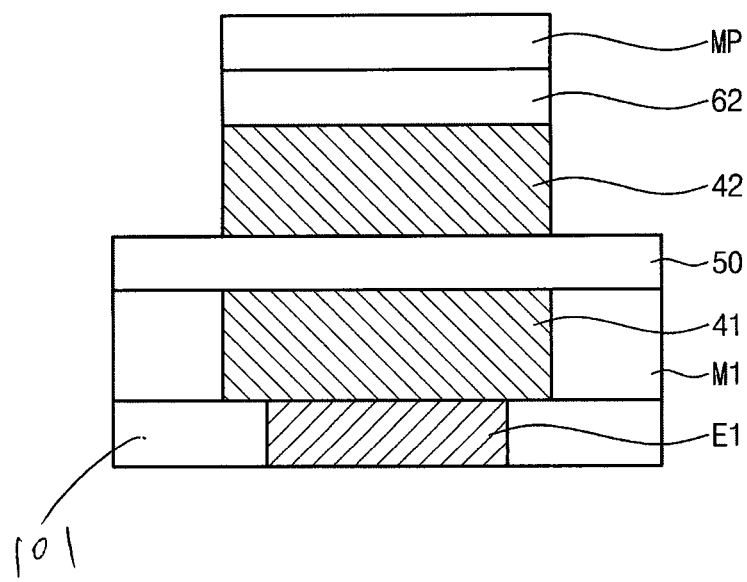

Referring to FIGS. 9 and 12, the upper magnetic structure 42 may be selectively formed on the tunnel bather layer 50 during another step (S30). For example, an upper insulating layer may be formed on the tunnel bather layer 50 to have an opening exposing a top surface of the tunnel barrier layer 50 on the lower magnetic structure 41, and the upper magnetic structure 42 may be formed in the opening of the upper insulating layer.

The upper magnetic structure 42 may include a plurality of metal-containing layers, at least one of which may be a magnetic layer. The selective formation of the upper magnetic structure 42 will be described in more detail with reference to FIGS. 16 through 18.

As shown in FIG. 12, an upper electrode structure 62 and a mask pattern MP may be sequentially formed on the upper magnetic structure 42. The mask pattern MP and/or the upper electrode structure 62 may be used as an etch mask during the formation of the upper magnetic structure 42. However, the inventive concepts are not limited to these specific examples, in which the mask pattern MP and the upper electrode structure 62 are formed or are used as the etch mask.

Figure 13:
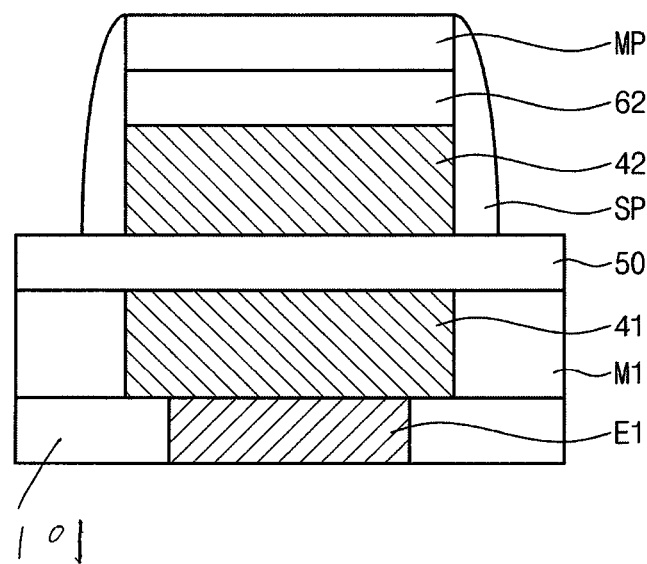

Referring to FIGS. 9 and 13, in a further step (S40) spacers SP may be formed on sidewalls of the upper magnetic structure 42. For example, the formation of the spacers SP may include conformally forming a spacer layer on the resulting structure including the upper magnetic structure 42, and then, anisotropically etching the spacer layer to expose portions of the tunnel barrier layer 50.

The spacers SP may be formed in such a way that a total width of the spacers SP and the upper magnetic structure 42 therebetween is greater than a width of the lower magnetic structure 41. The upper magnetic structure 42 may be covered with the spacers SP and the mask pattern MP. Therefore, the upper magnetic structure 42 may not be exposed to the outside. By contrast, the tunnel barrier layer 50 may include at least one portion exposed by the spacers SP.

Figure 14:
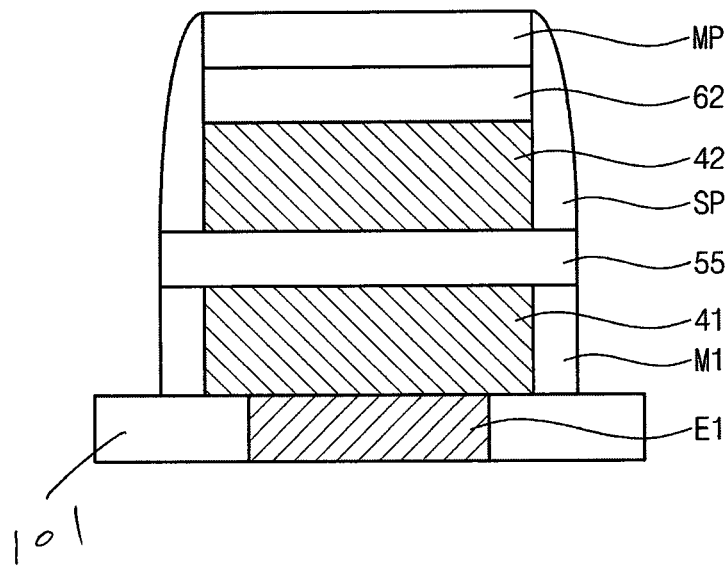

Referring to FIGS. 9 and 14, the tunnel barrier layer 50 may be patterned to form the tunnel barrier 55 in an additional step (S50). The formation of the tunnel barrier 55 may include removing the exposed portion of the tunnel barrier layer 50 using the spacers SP and the mask pattern MP as an etch mask.

According to an example embodiment of the inventive concepts, when the tunnel barrier layer 50 is patterned, each of the lower and upper magnetic structures 41 and 42 may be formed in a localized region and may not be exposed by an etchant to be used in the removal process. For example, the removal process may include a step of dry etching the exposed portion of the tunnel barrier layer 50 using an etching gas. However, the etching gas may be kept from coming into direct contact with the lower and upper magnetic structures 41 and 42. Accordingly, it is possible to substantially prevent a metallic residue from being produced from the metal-containing layers in the lower and upper magnetic structures 41 and 42.

In example embodiments, the patterning of the tunnel bather layer 50 may further include etching of the lower insulating layer M1. For example, the additional etching step may be performed to etch anisotropically the lower insulating layer M1 with an etch recipe having an etch selectivity with respect to the spacers SP and/or the mask pattern MP. As described above, the total width of the spacers SP and the upper magnetic structure 42 may be greater than the width of the lower magnetic structure 41. Accordingly, the lower magnetic structure 41 may not be exposed to an etchant material used in etching the lower insulating layer M1. As a result, even if the lower insulating layer M1 is etched, it is possible to substantially prevent a metallic residue from being produced from the metal-containing layer in the lower magnetic structure 41.

Figure 15:
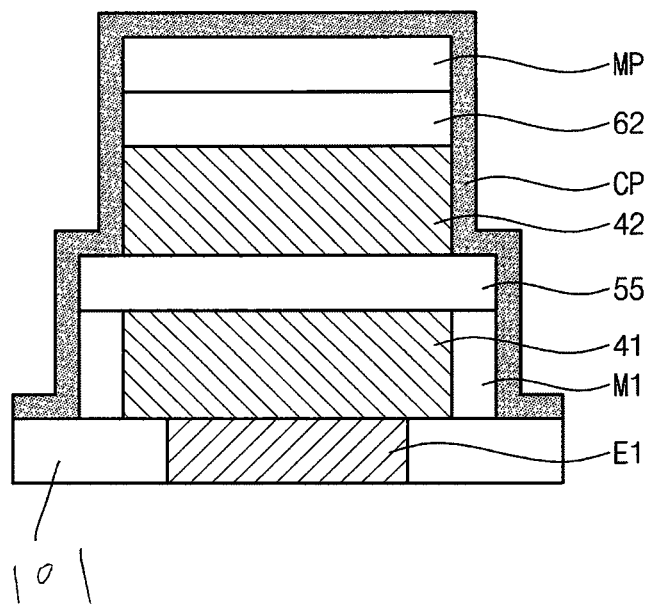

Referring to FIGS. 9 and 15, in a further step (S60), a capping layer CP may be formed on the resulting structure including the tunnel barrier 55. The capping layer CP may include one or more insulating materials. The capping layer CP may also include a material such as Ru, Ta, Ru/Ta, Ru/Ta/Ru or other capping layer material.

In some embodiments, at least one of the spacers SP or the mask pattern MP may be removed before the formation of the capping layer CP. For example, if the spacers SP are removed as shown in FIG. 15, the capping layer CP may be formed in direct contact with side surfaces of the upper magnetic structure 42 and with side and top surfaces of the tunnel barrier 55. If the lower insulating layer M1 is not removed, the capping layer CP may be formed spaced apart from the lower magnetic structure 41.

Hereinafter, various alternative methods are described for forming the lower and upper magnetic structures 41 and 42 and the tunnel barrier 55, in conjunction with Table 1 and FIGS. 16 through 22.

According to some embodiments, the tunnel barrier 55 may be formed by a patterning process to be described with reference to FIGS. 19 through 22, and each of the lower and upper magnetic structures 41 and 42 may be formed by one of the patterning process or a damascene process to be described with reference to FIGS. 16 through 18. For example, methods of forming a MTJ may be classified into four example embodiments identified in Table 1, but the inventive concepts are not limited to these specific embodiments.

TABLE 1

| Process/Structure | First Embodiment | Second Embodiment | Third Embodiment | Fourth Embodiment |
|---|---|---|---|---|
| Upper magnetic structure | Damascene/'U'-shape | Damascene/'U'-shape | Patterning/Plate-shape | Patterning/Plate-shape |
| Tunnel barrier | Patterning/Plate-shape | Patterning/Plate-shape | Patterning/Plate-shape | Patterning/Plate-shape |
| Lower magnetic structure | Damascene/'U'-shape | Patterning/Plate-shape | Damascene/'U'-shape | Patterning/Plate-shape |

Figure 16:
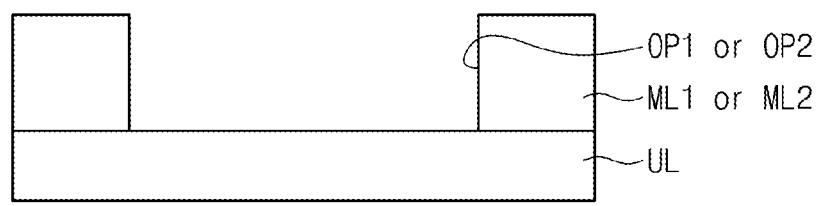
Figure 17:
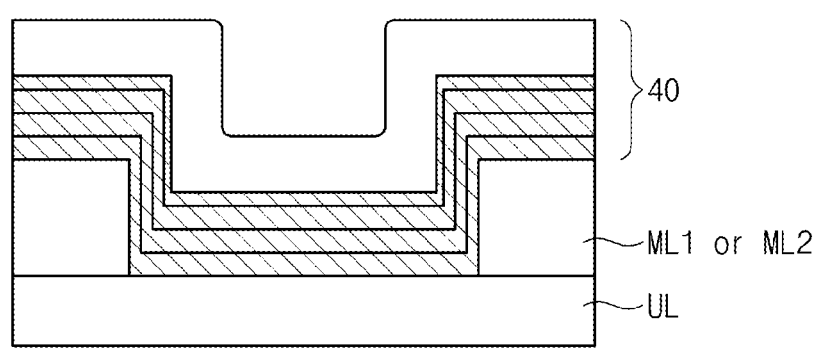
Figure 18:
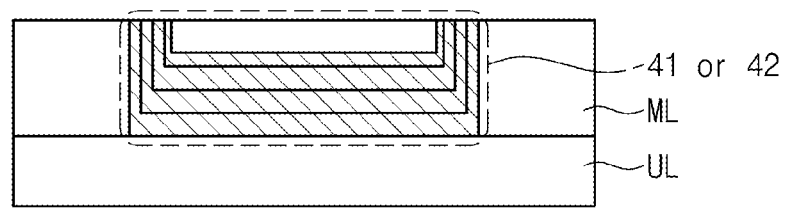

FIGS. 16 through 18 are cross-sectional views illustrating a damascene process, which may be used in a process of forming a MTJ according to some embodiments of the inventive concepts.

Referring to FIG. 16, a mold layer ML1 or ML2 may be formed on an underlying layer UL. The mold layer ML1 or ML2 may be formed of an insulating material such as silicon dioxide. The mold layer ML1 or ML2 may be formed to have an opening OP1 or OP2 exposing a selected region of the underlying layer UL. The opening OP1 or OP2 may be formed by a patterning process including photolithography and etching steps. If the lower or upper magnetic structure 41 or 42 is formed by a damascene process, the lower insulating layer M1 or the upper insulating layer maybe used as the mold layer ML1 or ML2 . See, for example, FIGS. 34A-34J.

Referring to FIG. 17, thin layers 40 for the lower or upper magnetic structure 41 or 42 may be formed on the mold layer ML1 or ML2. In some embodiments, the thin layers 40 may be formed to cover the mold layer ML1 or ML2 with the opening OP1 or OP2. In other embodiments, at least some of the thin layers 40 may be formed using a deposition technique having a predetermined level of step coverage. For example, at least two of the thin layers 40 may be formed using different deposition conditions from each other (e.g., in terms of step coverage). The deposition condition or the step coverage property may be selected in such a way that a thickness of the thin layers 40 is smaller on a sidewall of the opening OP than on a bottom surface of the opening OP. Due to the differences in the thickness of the thin layers 40 at different positions, the lower or upper magnetic structure 41 or 42 can be formed having an increased ratio between an effective area thereof and an area of the opening OP.

Referring to FIG. 18, the thin layers 40 may be etched or planarized to expose a top surface of the mold layer ML. Accordingly, the thin layers 40 may be selectively formed within the opening OP of the mold layer ML. In some embodiments, the etching of the thin layers 40 may be performed using a planarization technique, such as a chemical-mechanical polishing (CMP) process or an etch-back process.

Figure 36A:
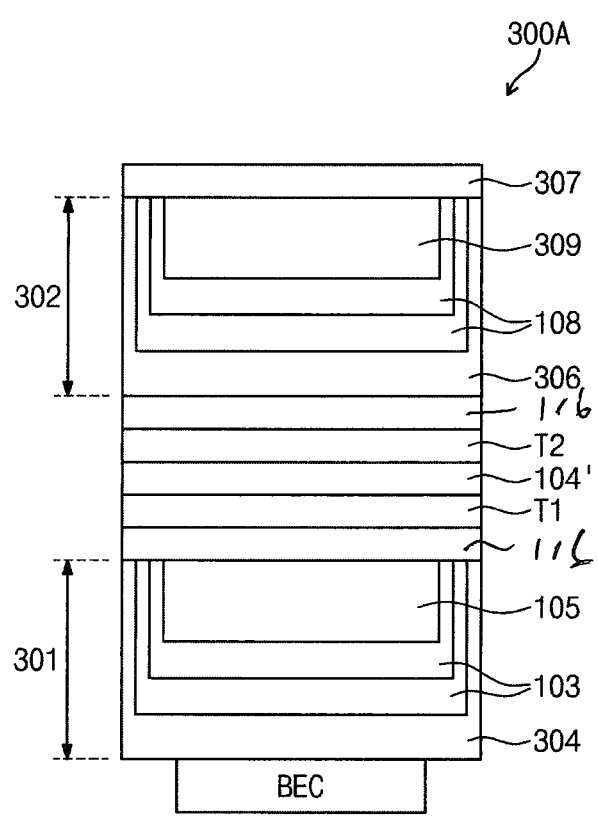
FIGS. 36A-36C are cross-sectional views illustrating magnetic devices formed according to some embodiments.

According to modified embodiments of the inventive concept, if the lower magnetic structure 41 is formed using the afore-described damascene process, the uppermost one of the thin layers 40 may not be used as a part of the lower magnetic structure 41. For example, the uppermost layer may be used as a sacrificial layer, which will be removed in a subsequent process and may be replaced with a layer 105 formed of a material such as Ta. (FIG. 36A)

FIGS. 19 through 22 are cross-sectional views illustrating a patterning process, which may be used in a process of forming a MTJ according to some embodiments.

Figure 19:
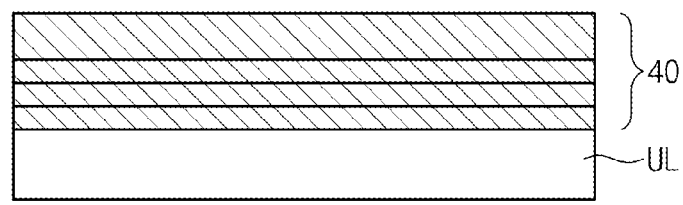

Referring to FIG. 19, thin layers 40 for the lower or upper magnetic structure 41 or 42 may be formed on an underlying layer UL. Each of the thin layers 40 may be formed using one of the deposition techniques to cover substantially the entire top surface of the underlying layer UL.

Figure 20:
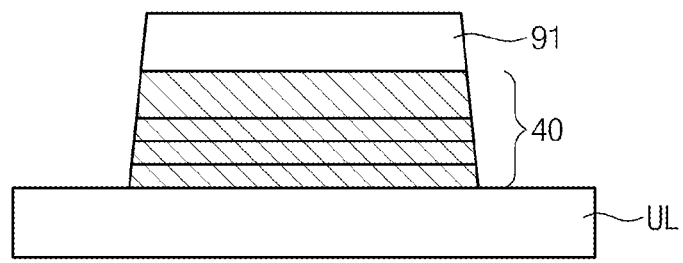

Referring to FIG. 20, a mask pattern 91 may be formed on the thin layers 40, and the thin layers 40 may be patterned using the mask pattern 91 as an etch mask. The patterning of the thin layers 40 may include an etching step, which may be performed in a dry or wet manner.

Figure 21:
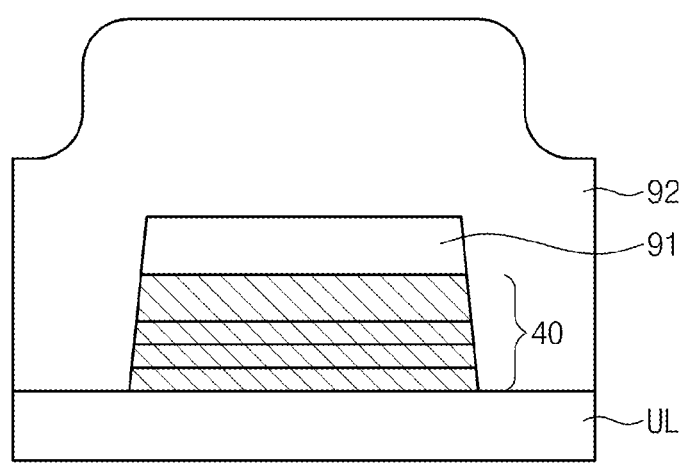
Figure 22:
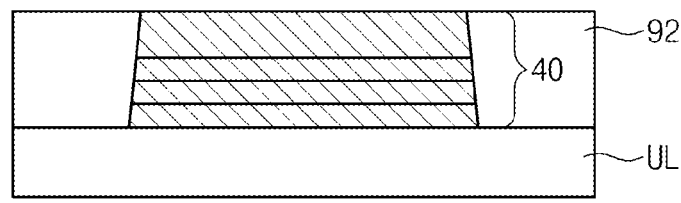

Referring to FIGS. 21 and 22, an insulating layer 92 may be formed to cover the patterned thin layers 40, and the insulating layer 92 may be etched to expose the uppermost layer of the thin layers 40 or the mask pattern 91. In some embodiments, the etching of the insulating layer 92 may be performed using a planarization technique, such as a CMP process or an etch-back process.

Figure 23:
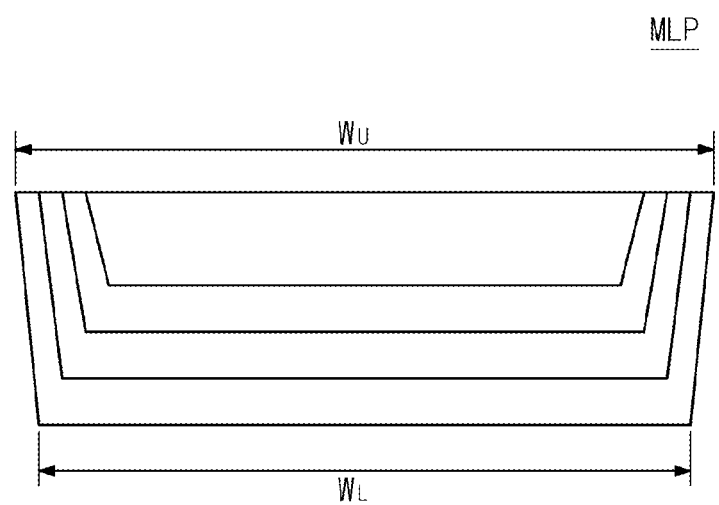
Figure 24:
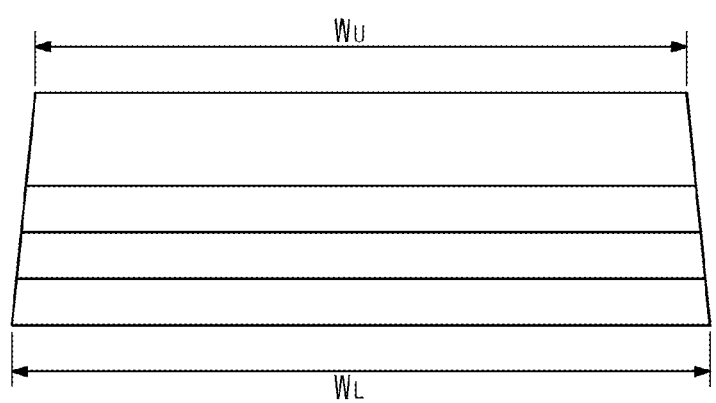

FIGS. 23 and 24 are cross-sectional views schematically illustrating structural features of the multilayered patterns formed by the damascene and patterning processes, respectively. The lower or upper magnetic structure 41 or 42 may be configured to have structural features of the multilayered pattern MLP, which will be described with reference to FIGS. 23 and 24.

For example, if the lower or upper magnetic structure 41 or 42 is formed by the damascene process described with reference to FIGS. 16 through 18, it can have the structural feature shown in FIG. 23. Alternatively, if the lower or upper magnetic structure 41 or 42 is formed by the patterning process described with reference to FIGS. 19 through 22, it can have the structural feature shown in FIG. 24.

Referring to FIG. 23, at least one of the thin layers 40 may be formed to have a 'U'-shaped cross section. For example, as shown, if the multilayered pattern MLP consists of four layers, three remaining layers except for the uppermost layer may be formed to have the 'U'-shaped cross section.

According to the damascene process, the opening OP may be formed having a slanted sidewall. For example, the opening OP may be formed having a slightly greater width at a top than at a bottom thereof. Here, because the lower or upper magnetic structure 41 or 42 may be selectively formed within the opening OP, an upper width $W_U$ thereof can be greater than a lower width $W_L$ thereof (i.e., $W_U > W_L$), as shown in FIG. 23.

Referring to FIG. 24, according to the patterning process, each of the thin layers 40 may be formed to cover substantially the entire top surface of the underlying layer UL using one of deposition techniques, and in this case, cross sections of the thin layers 40 may be determined by a profile of a top surface of the underlying layer UL. For example, if the underlying layer UL has a flat top surface, each of the thin layers 40 may have a quadrilateral cross section, as shown for example in FIG. 24.

On the other hand, if the patterning process is used, the lower or upper magnetic structure 41 or 42 may have the upper width $W_U$ smaller than the lower width $W_L$ (i.e., $W_U < W_L$), as shown in FIG. 24. In this case, each of the thin layers 40 may have a trapezoidal cross section, with a top width narrower than its bottom.

FIGS. 25 through 28 are cross-sectional views illustrating magnetic tunnel junctions according to some embodiments. FIGS. 25 through 28 show magnetic tunnel junctions according to the four example embodiments identified in Table 1, respectively.

Figure 25:
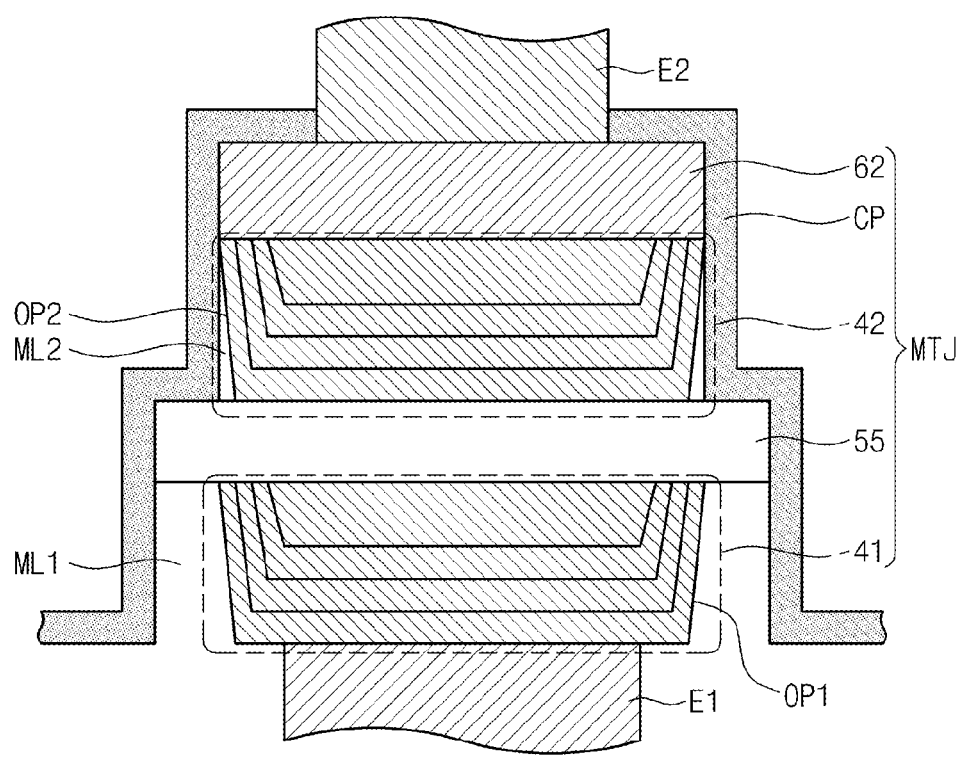

According to the first embodiment of Table 1, the lower and upper magnetic structures 41 and 42 may both be formed using the damascene process, while the tunnel barrier 55 may be formed using the patterning process. Accordingly, as shown in FIG. 25, each of the lower and upper magnetic structures 41 and 42 may include at least one layer having a 'U'-shaped cross section. In particular, according to one embodiment, a magnetic device may be formed by selectively forming a lower magnetic structure 41 within an opening, such as a first opening OP1 of a first mold layer ML1. The lower magnetic structure 41 may be coupled to a first electrode E1. Then, a non-magnetic spacer layer, such as the tunnel barrier 55, is formed overlying the selectively-formed lower magnetic structure 41. Next, an upper magnetic structure 42 may be formed within a second opening OP2 of a second mold layer ML2 on the non-magnetic spacer layer. the upper magnetic structure 42 may be coupled to a second electrode E2.

Figure 32:
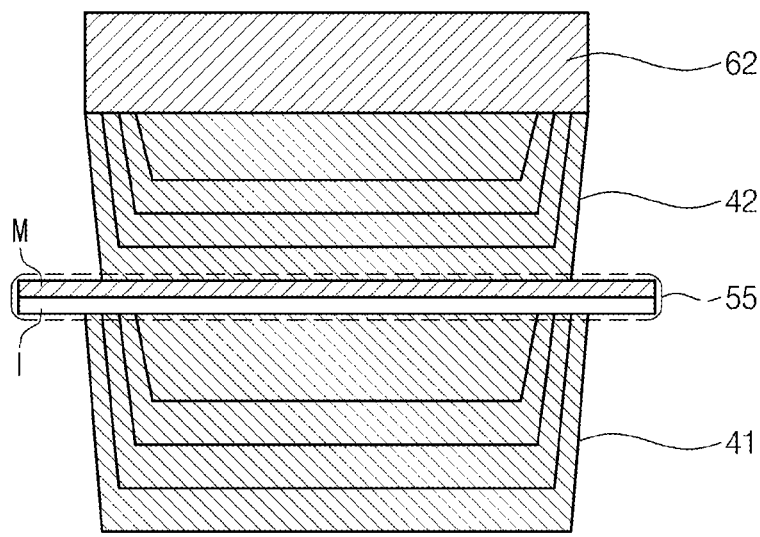
Figure 33:
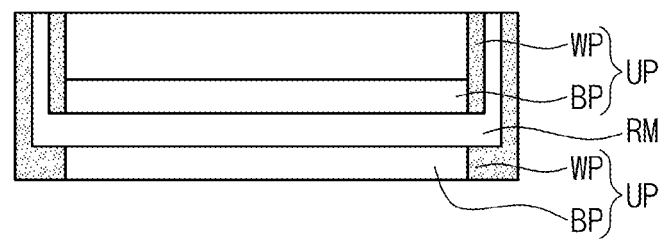

In some embodiments, the non-magnetic spacer layer resides in a selected region between the upper and lower magnetic structures 41 or 42, as illustrated in, for example, FIGS. 25 and 32-33.

Figure 26:
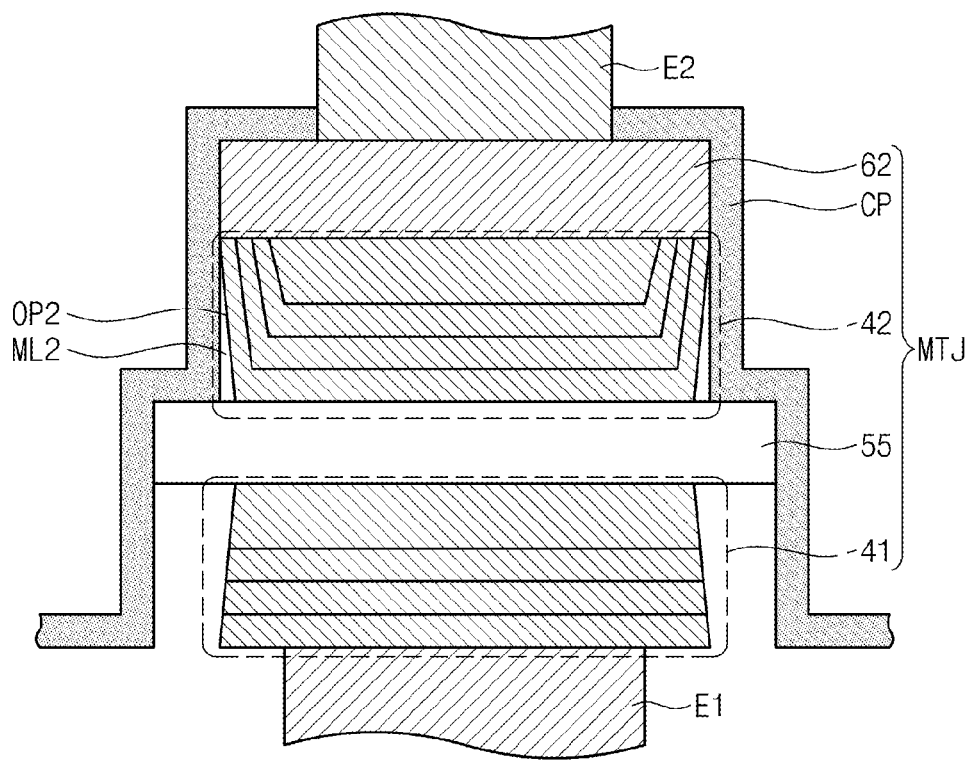

According to the second embodiment of Table 1, the upper magnetic structure 42 may be formed using the damascene process, while the lower magnetic structure 41 and the tunnel barrier 55 may be formed using the patterning process. Accordingly, as shown in FIG. 26, the upper magnetic structure 42 may include at least one layer having a 'U'-shaped cross section, and the layers constituting the lower magnetic structure 41 may be formed having a quadrilateral cross section.

Figure 27:
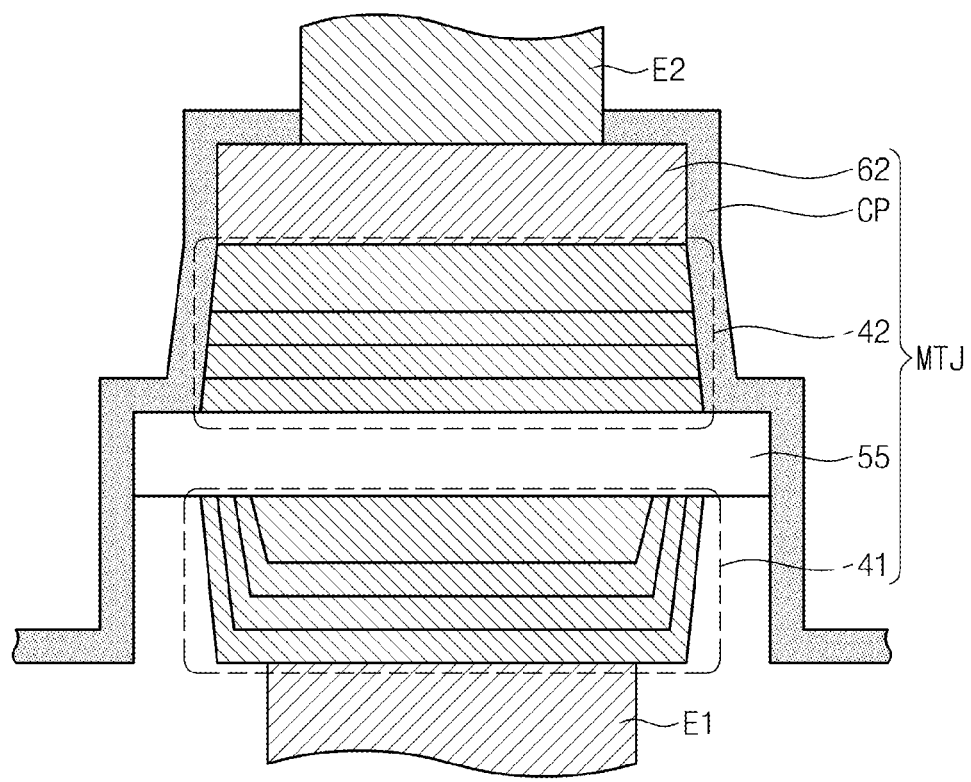

According to the third embodiment of Table 1, the lower magnetic structure 41 may be formed using the damascene process, while the upper magnetic structure 42 and the tunnel bather 55 may be formed using the patterning process. Accordingly, as shown in FIG. 27, the lower magnetic structure 41 may include at least one layer having a 'U'-shaped cross section, and the layers constituting the upper magnetic structure 42 may be formed having quadrilateral cross sections.

Figure 28:
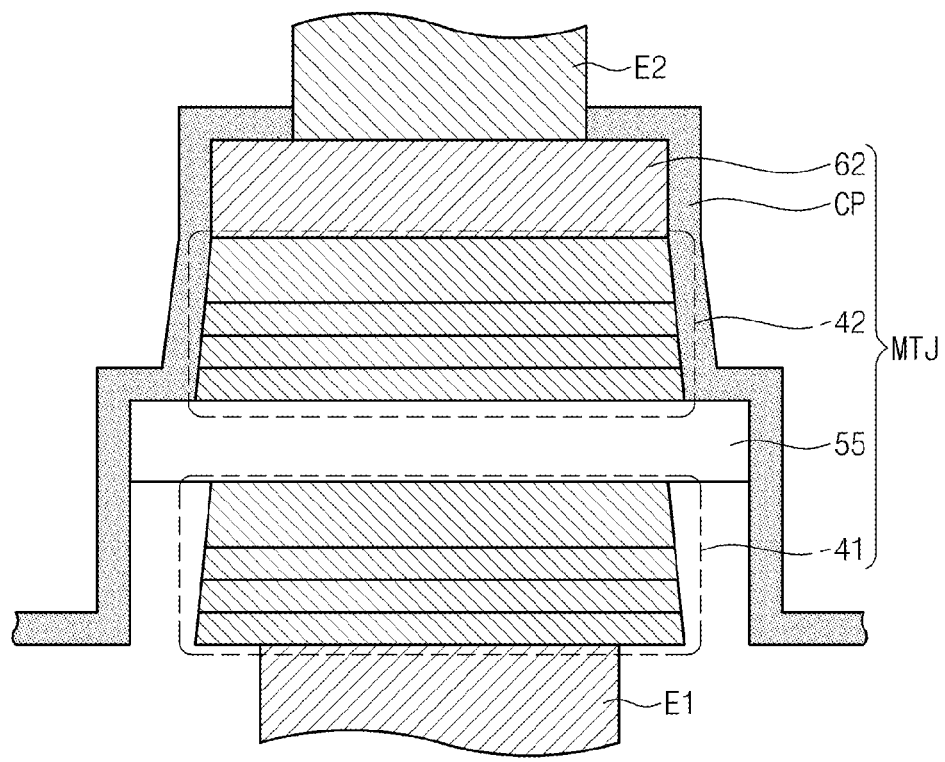

According to the fourth embodiment of Table 1, the lower and upper magnetic structures 41 and 42 and the tunnel bather 55 may be formed using the patterning process. Accordingly, as shown in FIG. 28, the layers constituting each of the lower and upper magnetic structures 41 and 42 may each be formed having a quadrilateral cross section.

In all four embodiments described above, the tunnel barrier 55 may be formed using the patterning process, and thus, the tunnel barrier 55 may be formed having a quadrilateral cross section. Also, the tunnel barrier 55 may extend in a substantially straight line in cross-sectional view in some or all of the embodiments discussed herein.

Figure 29:
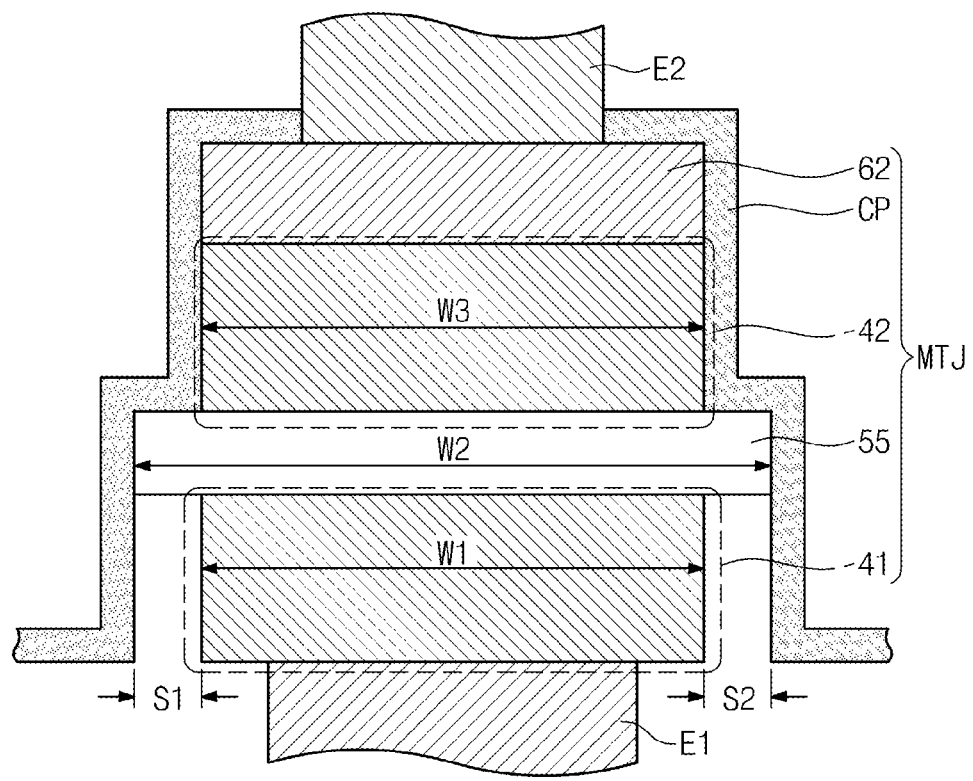

FIG. 29 is a cross-sectional view for explaining the structural features of a MTJ. Table 2 indicates the relative widths of structures in the MTJ according to various example embodiments of the inventive concepts.

TABLE 2

| | Pattern Width | | |
|---|---|---|---|
| | W1 vs. W2 | W2 vs. W3 | W3 vs. W1 |
| First Embodiment | W2 > W1 | W2 > W3 | W3 < W1 |
| Second Embodiment | W2 > W1 | W2 > W3 | W3 ≈ W1 |
| Third Embodiment | W2 > W1 | W2 > W3 | W3 > W1 |
| Fourth Embodiment | W2 > W1 | W2 ≈ W3 | W3 > W1 |

Referring to FIG. 29, the designations W1, W2, and W3 in Table 2 represent widths of the lower magnetic structure 41, the tunnel barrier 55, and the upper magnetic structure 42, respectively. The inventive concepts are not limited to those embodiments identified in Table 2.

In all four embodiments, the tunnel barrier 55 may be formed to have a width substantially greater than that of the lower magnetic structure 41 (i.e., W2>W1, where W2−W1 is not negligible). Accordingly, the lower magnetic structure 41 may not be exposed during the patterning of the tunnel bather 55.

In some embodiments, the tunnel bather 55 may be formed to have a width substantially greater than that of the upper magnetic structure 42 (i.e., W2>W3). For example, according to the fabricating method described above, the tunnel barrier 55 may be patterned using the spacer SP covering the sidewall of the upper magnetic structure 42 as an etch mask, thereby providing the relationship of W2>W3.

However, in some embodiments, the tunnel barrier 55 may be formed to have substantially the same width as that of the upper magnetic structure 42 (i.e., W2≈W3). Such a structural feature may be achieved by forming the tunnel barrier 55 using the upper magnetic structure 42 as an etch mask.

In some embodiments, the lower magnetic structure 41 may be formed to have a width greater than that of the upper magnetic structure 42 (i.e., W3<W1). In some other embodiments, the lower and upper magnetic structures 41 and 42 may have the substantially same width as each other (i.e., W3≈W1). In still other embodiments, the lower magnetic structure 41 may be formed to have a width smaller than that of the upper magnetic structure 42 (i.e., W3>W1).

In some embodiments, the MTJ may be configured in such a way that a space or distance between the sidewalls of the tunnel barrier 55 and the sidewalls of the lower magnetic structure 41 may be different at both sides of the tunnel barrier 55. For example, referring back to FIG. 29, the distance measured at a left side of the tunnel barrier 55 (hereinafter, referred to as a first distance S1) may be different from the distance measured at a right side of the tunnel barrier 55 (hereinafter, referred to as a second distance S2). A difference between the distances S1 and S2 may result from the fact that positions of the tunnel barrier 55 and the lower magnetic structure 41 are defined by different and distinct photolithography processes. For example, if a misalignment between preceding and subsequent photolithography processes is smaller than an allowable alignment margin, the subsequent photolithography process may be performed as it is without a rework process. In this case, a misalignment between two patterns formed by the photolithography processes may be the same as the misalignment between the photolithography processes. The difference in space between the sidewalls (e.g., S1−S2) may result from the misalignment between the photolithography processes.

According to some embodiments, the tunnel bather 55 may be formed using the upper magnetic structure 42 or the mask pattern MP thereon as an etch mask. In this case, there may be no difference in distances between the sidewalls of the tunnel barrier 55 and the upper magnetic structure 42.

Figure 30:
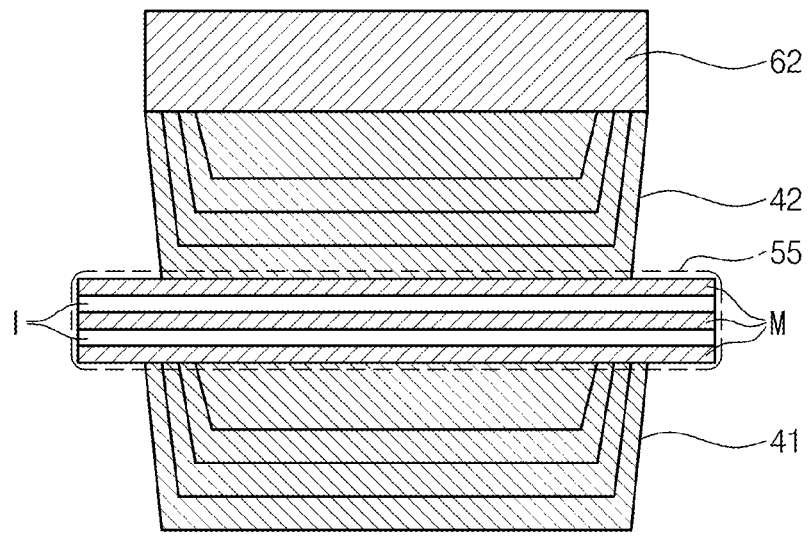
Figure 31:
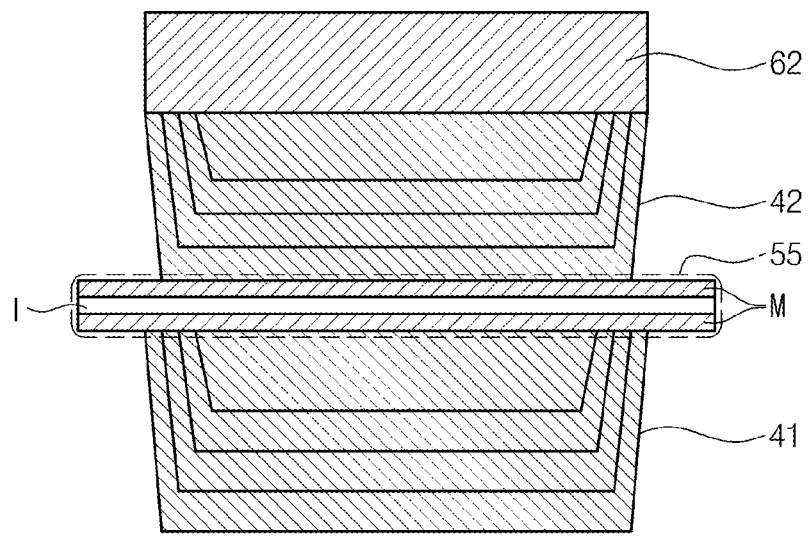

FIGS. 30 through 32 are sectional views illustrating examples of a tunnel barrier in a magnetic tunnel junction according to some embodiments.

The tunnel barrier 55 may be provided in the form of a multi-layered structure including at least one insulating layer I and at least one metal layer M. For example, as shown in FIG. 30, the tunnel barrier 55 may include a pair of insulating layers I and three metal layers M, which may be alternately stacked on the lower magnetic structure 41. Alternatively, as shown in FIG. 31, the tunnel barrier 55 may include a pair of insulating layers I and a metal layer M interposed therebetween. In still other embodiments, as shown in FIG. 32, the tunnel barrier 55 may include an insulating layer I and a metal layer M stacked one above the other on the lower magnetic structure 41. In some embodiments, the insulating layer(s) I may be formed of magnesium oxide, and the metal layer(s) M may be formed of a metal-containing material.

FIG. 33 is a sectional view exemplarily and schematically illustrating a magnetic structure formed by the damascene process.

If the lower or upper magnetic structure 41 or 42 is formed by the damascene process described with reference to FIGS. 16 through 18, it may include at least one layer having a "U"-shaped cross section, as shown for example in FIG. 23. Referring to FIG. 33, the lower or upper magnetic structure 41 or 42 may include a "U"-shaped pattern UP having a flat bottom portion BP and a sidewall portion WP extending upward from an edge of the bottom portion BP.

According to alternative modified embodiments of the inventive concept, a sidewall oxidation process may be performed to the lower or upper magnetic structure 41 or 42 formed by the damascene process. For example, the sidewall oxidation process may include supplying oxygen into the lower magnetic structure 41 through a side surface of the lower magnetic structure 41, before depositing the tunnel barrier layer 50. Then, at least one of magnetic layers constituting the lower magnetic structure 41 may react with the supplied oxygen and form a metal oxide layer serving as the sidewall portion WP. By controlling a diffusion length or permeation depth of the oxygen, the bottom portion BP can be substantially prevented from being oxidized. Accordingly, the bottom portion BP may be formed of a metallic material (e.g., a ferromagnetic or antiferromagnetic material), and the sidewall portion WP may be formed of a metal oxide layer, which is an oxide of the metallic material constituting the bottom portion BP.

As the result of the selective or localized oxidation of the sidewall portion WP, it is possible to substantially prevent the magnetic tunnel junction MTJ from exhibiting an unintended physical effect. For example, as the result of the oxidation, the sidewall portion WP may be demagnetized such that it does not affect a magnetic behavior of the magnetic tunnel junction MTJ.

The lower or upper magnetic structure 41 or 42 may include at least one rare metal layer RM formed of a rare metal (e.g., ruthenium (Ru), iridium (Ir) or rhodium (Rh)). In some embodiments, the rare metal layer RM may be selected to have a low oxygen affinity, and thus, there may be substantially no difference in chemical composition between sidewall and bottom portions of the rare metal layer RM.

Figure 34A:
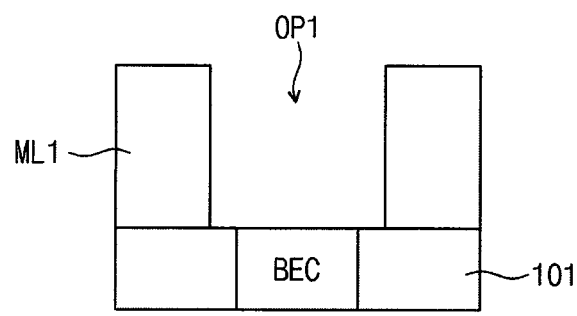
FIGS. 34A-34J are cross-sectional views illustrating a method of fabricating a magnetic tunnel junction according to modified example embodiments of the inventive concept.

According to some embodiments, as shown in FIG. 34A, a magnetic device may be formed by forming an interlayer dielectric layer 101 having a bottom electrode contact BEC on a substrate (not illustrated).

Figure 34B:
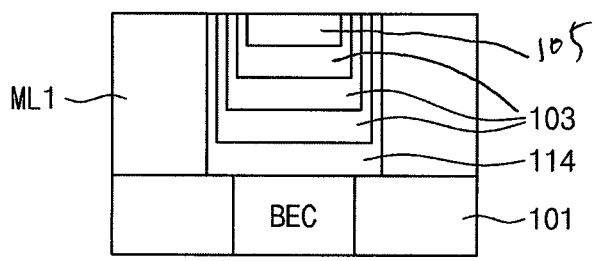

A first mold layer ML1 may be formed overlying the interlayer dielectric layer 101 as shown in FIG. 34B. The first mold layer ML1 may have a first opening OP1 to expose at least a portion of the bottom electrode contact BEC or any other suitable underlying layer. Then, a first fixed layer 103 (or a reference layer formed of a magnetic material, e.g., a ferromagnetic material) may be selectively formed within the first opening OP1 to have a generally U-shaped cross section, using a method similar to the processing steps discussed in connection with FIG. 23. Alternatively, the first fixed layer 103 may be formed using a method different from the method discussed in FIG. 23. For example, selective epitaxial growth techniques can be used to form the first fixed layer 103. The fixed layer 103 may be a synthetic antiferromagnetic (SAF) layer including magnetic layers anti-ferromagnetically coupled through thin conductive layers, such as Ru layers. An optional seed layer 114 may be formed within the first opening OP1 before forming the first fixed layer 103 depending on the particular application. The seed layer 114 may be utilized, for example, to aid in the growth of subsequent layers.

Figure 34C:
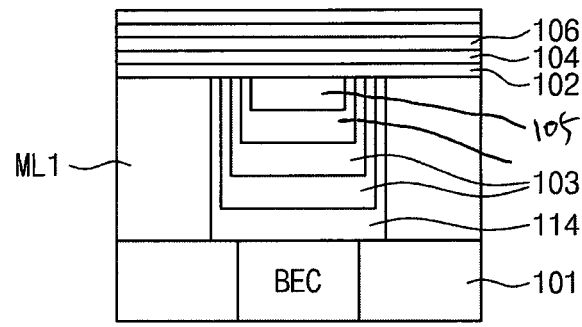

A first tunnel barrier layer 102 may then be formed over the first fixed layer 103 and over the top surface of the first mold layer ML1 as shown in FIG. 34C.

Figure 34D:
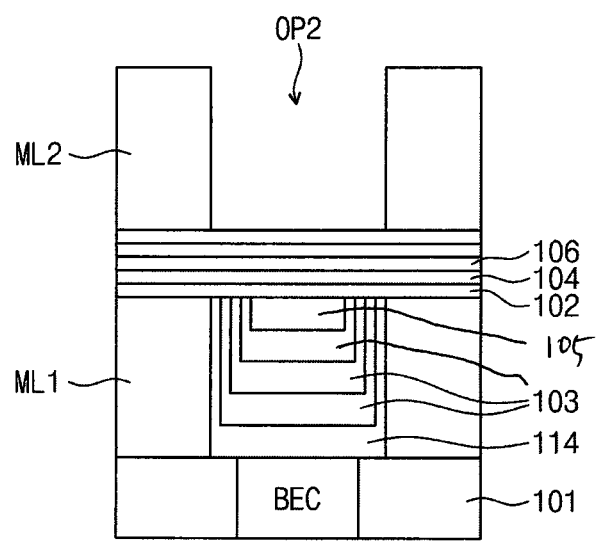

Then, a free layer 104 may be formed over the first tunnel barrier layer 103. Subsequently, a second tunnel barrier layer 106 is formed over the free layer 104. In addition, a second mold layer ML2 having a second opening OP2 may be formed overlying the second tunnel barrier layer 106 therein as shown in FIG. 34D.

Figure 34E:
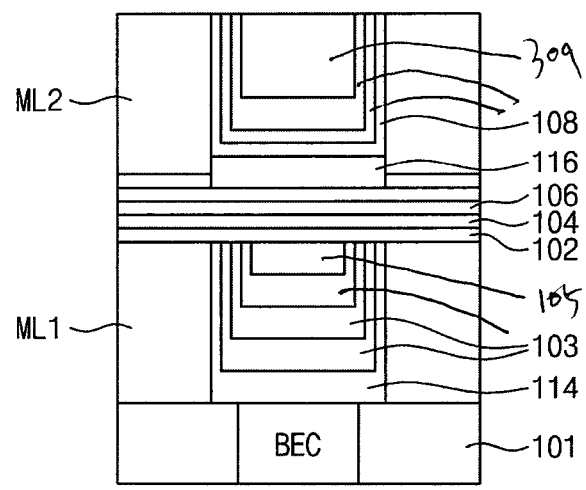
Figure 34F:
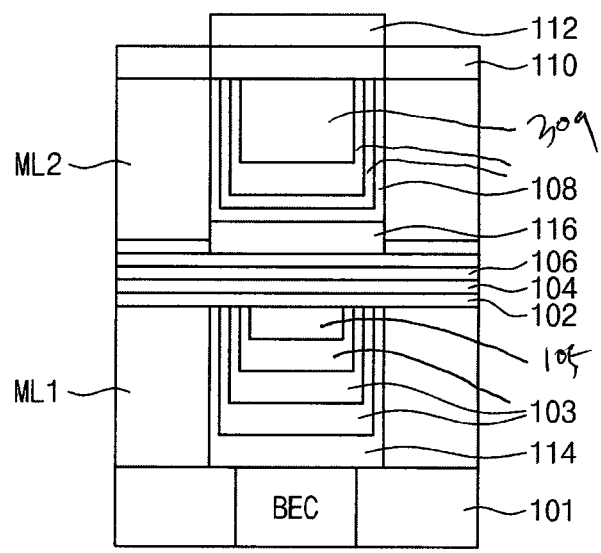

Next, a second fixed layer 108 may be selectively formed within the second opening OP2 to have a generally U-shaped cross section, as shown in FIG. 34E, using a method similar to the processing steps discussed in connection with FIG. 23. Alternatively, the second fixed layer 108 may be formed using a method different from the method discussed in FIG. 23. For example, selective epitaxial growth techniques may be used to form the second fixed layer 108. In this case, an optional seed layer 116 may be formed, for example, within the second opening OP2 before forming the second fixed layer 108.

In some embodiments, the first and second fixed layers 103, 108 are depicted as a double-layer structure. However, the first fixed layer 103, the second fixed layer 108, or both, may have a single-layer structure or multi-layer structures of more than two layers.

As discussed above, a mask pattern 112 may be formed over the resulting structure as shown in FIG. 34E. Optionally, a capping layer 110 may be formed over the selectively-formed second fixed layer 108 before forming the mask pattern 112.

Figure 34G:
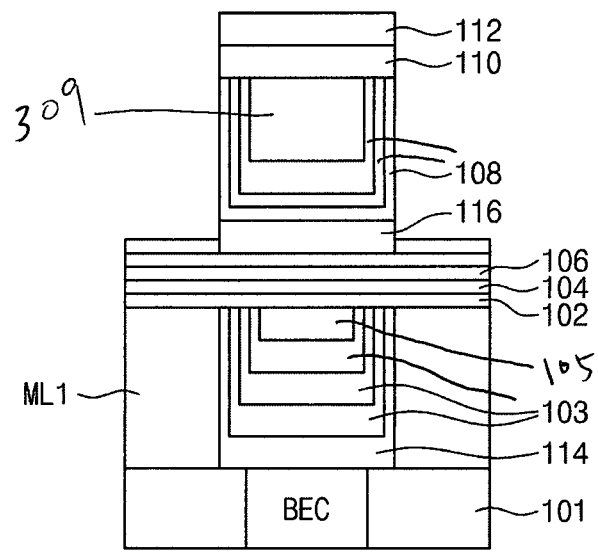

Then, the second mold layer ML2 may be etched using the mask pattern 112 as an etch mask as shown in FIG. 34G.

Figure 34H:
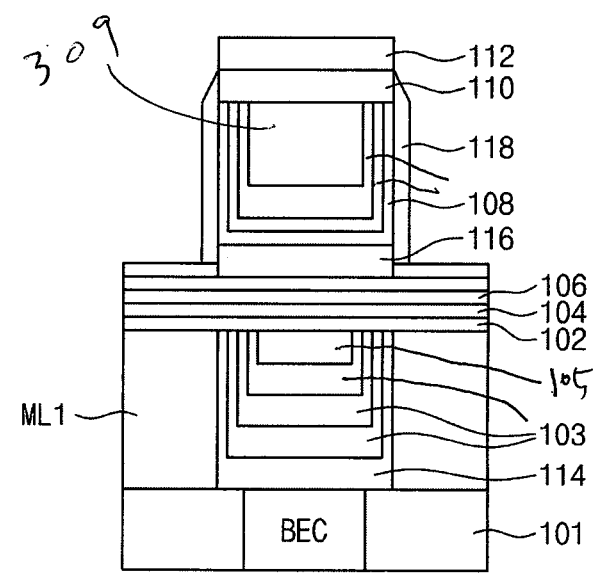
Figure 34I:
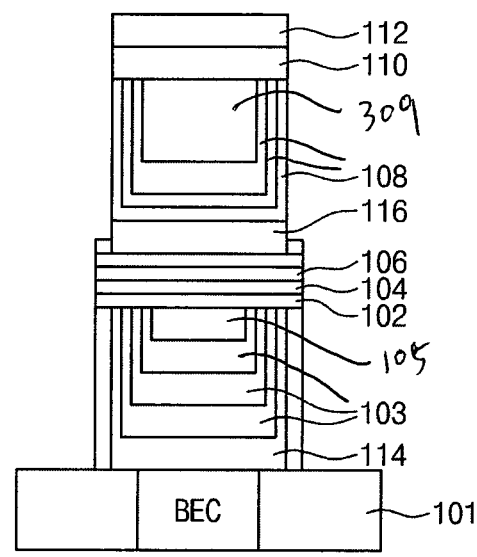

Optionally, a spacer 118 may be formed overlying sidewalls of the second fixed layer 108 before patterning the second tunnel barrier layer 106, the free layer 104, and the first tunnel barrier layer 102 to form a first tunnel barrier T1, a free layer pattern 104', and a second tunnel bather T2 as shown in FIGS. 34H and 34I.

Subsequently, the first mold layer ML1 may be etched using methods similar to those discussed in connection with FIGS. 13 and 14, as shown in FIG. 34I.

Figure 34J:
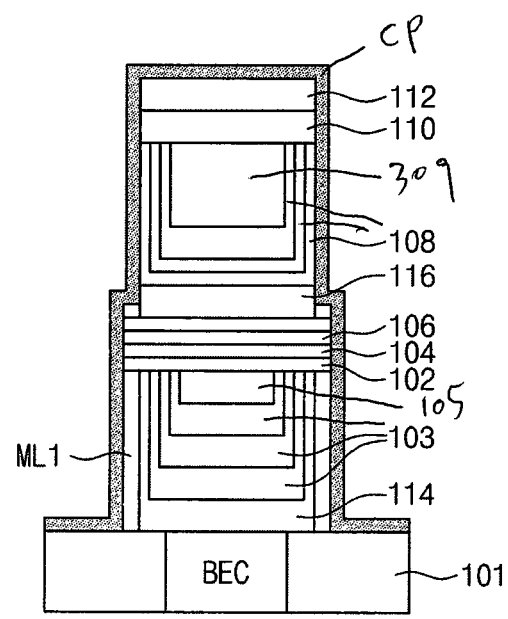

The spacer 118 may then be removed and another capping layer 120 may be optionally formed to cover the resulting structure, including the first and second fixed layers 103, 108 and the free layer pattern 104' as shown in FIG. 34J.

In some embodiments, one of skill in the art will recognize that various insertion layers may be added to the magnetic device for various reasons, for example, increasing perpendicular magnetic anisotropy or lattice matching, or aiding in the growth of subsequent layers and so on.

With some embodiments of the present disclosure, various layers such as the fixed layers 103, 108 may be formed using a damascene process. As a result, issues involving the patterning of a tunnel barrier material, e.g., metal etch residue issues such as a re-deposition of a tunnel barrier material after the patterning, may not be present. This is because a magnetic layer need not be patterned as in the conventional art. Also, if the dual damascene process is used as in the present application, because some of the layers constituting the magnetic device can be formed in an opening of a lower mold layer while the other layers constituting the magnetic device can be formed in an opening of an upper mold layer, the fabrication of a highly-integrated magnetic device may be possible. This would not have been possible with a single damascene process, which would require the formation of all necessary layers constituting the magnetic device in a single opening. Also, a contact to the magnetic device may be formed more easily with the embodiments of the present disclosure, as the embodiments of the present disclosure may utilize a multi-level structure using a multi-step process as opposed to a single-level single step process.

Figure 35:
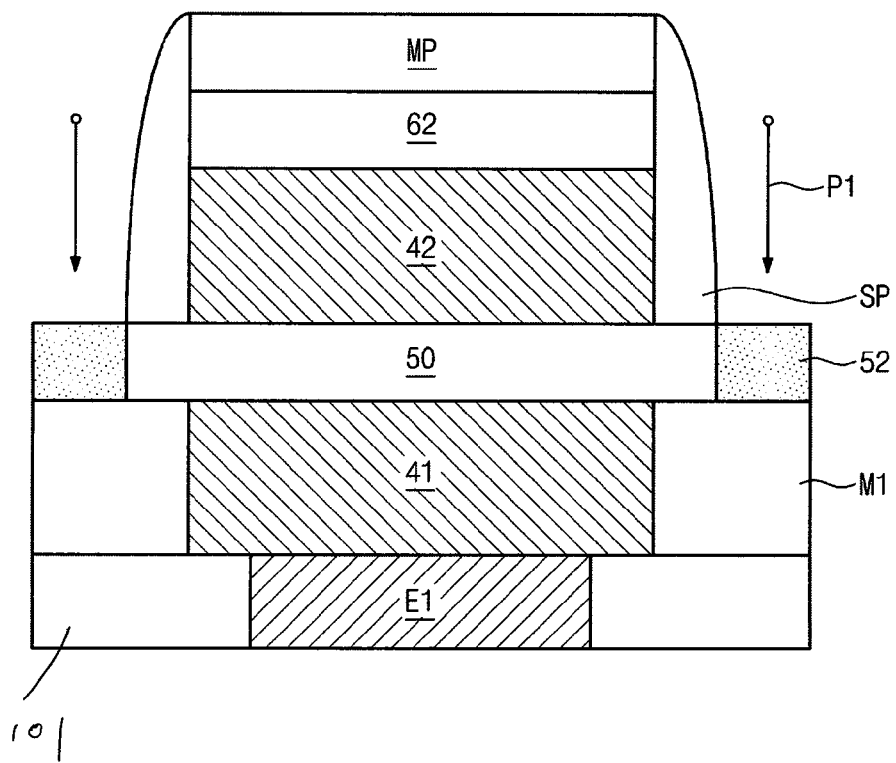

FIG. 35 is a cross-sectional view illustrating a method of fabricating a MTJ according to a modified example embodiment of the inventive concepts. For example, the method discussed in connection with FIG. 35 may be used to perform processing steps discussed in FIGS. 34H and 34I.

Referring to FIG. 35, after the formation of the spacer SP described with reference to FIG. 13, a pre-treatment process P1 may be further performed on the tunnel barrier layer 50. The pre-treatment process P1 may allow the tunnel barrier layer 50 to be easily etched in the etching step thereof described with reference to FIG. 14. For example, the pre-treatment process P1 may include injecting ions into a portion 52 of the tunnel barrier layer 50 exposed by the spacer SP and the mask pattern MP. The ion injection process may lead to a change in its chemical composition. Also, the portion 52 of the tunnel bather layer 50 may be physically damaged, due to the presence or the kinetic energy of the ions. As a result, the exposed portion 52 of the tunnel barrier layer 50 may be easily etched in the etching step, compared with other portions covered with the upper magnetic structure 42. Such a pre-treatment process can help reduce a difference between top and bottom widths of the tunnel barrier 55.

Using the inventive concepts discussed above, various magnetic devices or elements can be formed. For example, as shown in FIG. 36A, a dual magnetic tunnel junction (DMTJ) magnetic device 300A may include a bottom electrode contact BEC; a first fixed layer 103 in a first region 301 electrically coupled to the bottom electrode contact BEC; a first tunnel barrier T1 overlying the first fixed layer 103; a free layer pattern 104' overlying the first tunnel barrier T1; a second tunnel barrier T2 overlying the free layer pattern 104'; and a second fixed layer 108 in a second region 302 overlying the second tunnel barrier T2. The first fixed layer 103 and the second fixed layer 106 each have a generally U-shaped cross section. A capping layer 30 is formed over the second fixed layer 108 and the layer 309.

In some embodiments, a size of the first region 301 may correspond to a thickness of the first mold layer ML1 shown, for example, in FIG. 34A; and a size of the second region 302 may correspond to a thickness of the second mold layer ML2 shown, for example, in FIG. 34D. The first region 301 may be an area defined by the first opening OP1 of the first mold layer ML1 and the second region 302 may be an area defined by the second opening OP2 of the second mold layer ML2. The second region 302 may be arranged substantially entirely above (or outside of) the first region 302.

In some embodiments, at least one of the first tunnel barrier T1 or the second tunnel barrier T2 may be disposed between the first region 301 and the second region 302 to form a magnetic device or magnetic element 300A as shown in FIG. 36A.

Figure 36B:
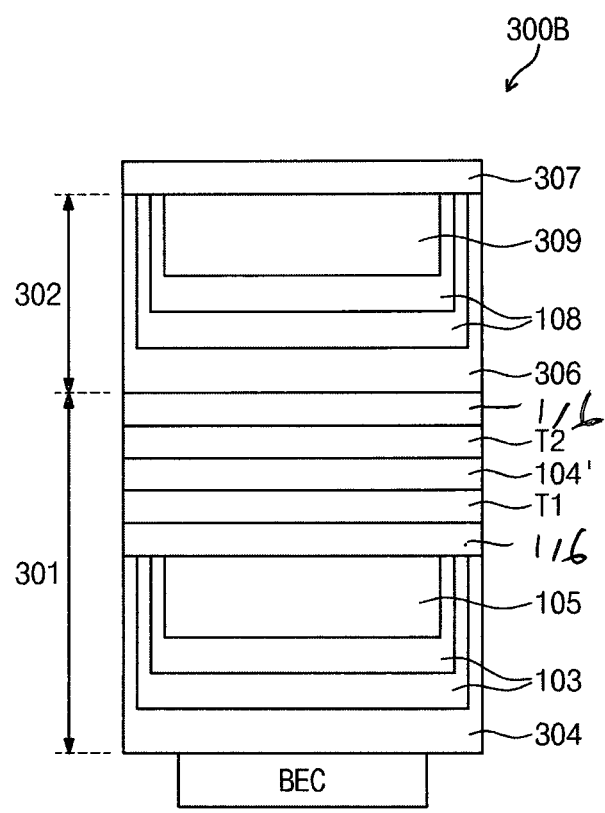

Alternatively, at least one of the first tunnel barrier T1 or the second tunnel barrier T2 may be formed within the first region 301 to form a magnetic device or magnetic element 300B as shown in FIG. 36B. In this case, the free layer pattern 104' may reside in the first region 301.

Figure 36C:
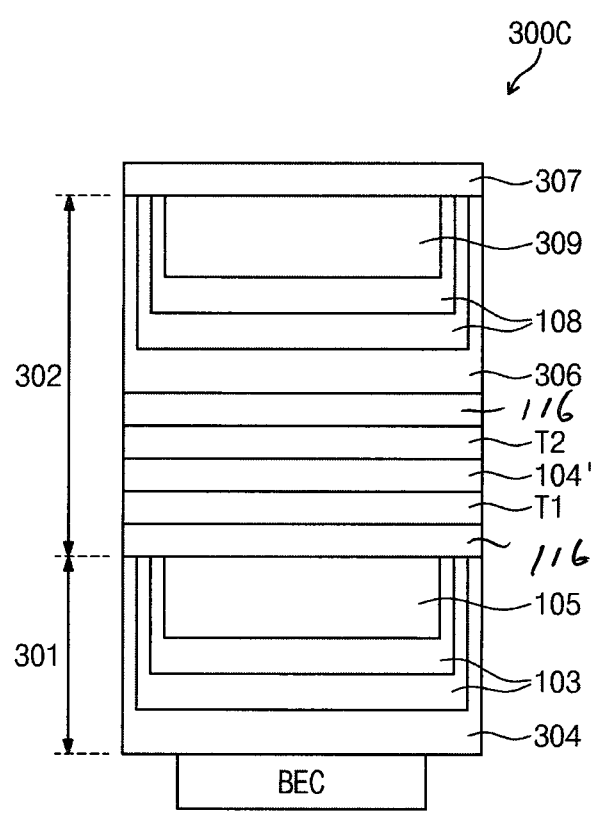

In some other embodiments, at least one of the first tunnel barrier T1 or the second tunnel barrier T2 may be formed within the second region 302 to form a magnetic device or magnetic element 300C as shown in FIG. 36C. In this case, the free layer pattern 104' may reside in the second region 302.

In some embodiments, although not illustrated, in the case of a single MTJ device, if a fixed layer is formed in a first region, then a free layer may be formed in a second region, or vice versa.

A tunnel barrier of the single MTJ may be either formed in the first region or the second region. Alternatively, the tunnel barrier of the single MTJ may be disposed between the first region and the second region.

In these embodiments, the tunnel barrier may extend in a substantially straight line or has a flat plate shape. Alternatively, the tunnel barrier may have a bent portion at its end to conform to the shape of the opening formed in the mold layers, if the tunnel barrier is formed within the hole.

The free layer pattern 104' may be a single layer or may include multiple layers. For example, the free layer pattern 104' may be a SAF including magnetic layers antiferromagnetically or ferromagnetically coupled through thin layers, such as Ru. The free layer pattern 104' may also be another multilayer. To switch the magnetization of the free layer pattern 104', a current is driven perpendicular to plane (in the z-direction).

Although not illustrated, a pinning layer such as antiferromagnetic (AFM) layer is optionally formed between the first fixed layer 103 and the bottom electrode contact BEC (or a suitable underlying layer). Also, a layer 309 that may act as a pinning layer (FIG. 36A) may be formed over the second fixed layer 108.

In some embodiments, a seed layer 304 may be disposed between the bottom electrode contact BEC and the first fixed layer 102. The seed layer 304 may have a generally U-shaped cross section. Another seed layer 306 maybe formed between the second tunnel barrier T2 and the second fixed layer 106.

In some embodiments, the first fixed layer 103 may be formed on inner sidewalls of the seed layer 304.

In some other embodiments, the magnetizations of the layers 103 and 108 are both perpendicular. In still other embodiments, one or both of the magnetizations of the layers 103 and 108 have components in plane and perpendicular to plane. As used herein, "in-plane" is substantially within or parallel to the plane of one or more of the layers of a magnetic junction. Conversely, "perpendicular" corresponds to a direction that is substantially perpendicular to one or more of the layers of the magnetic junction.

Figure 37:
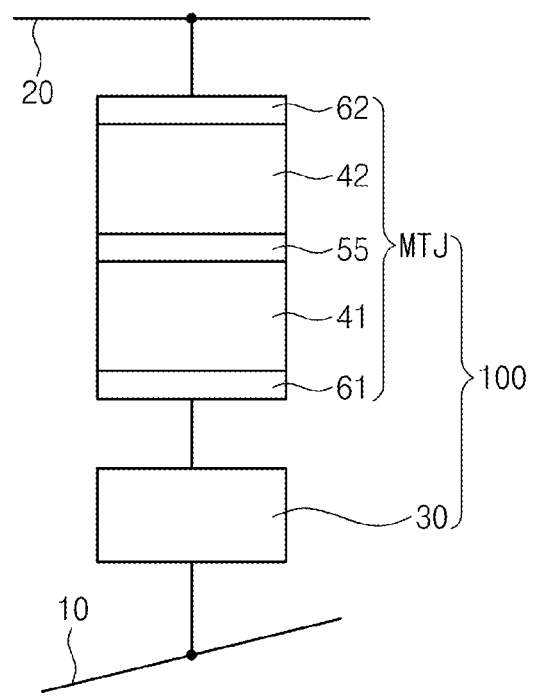

FIG. 37 is a schematic circuit diagram of a unit cell of a magnetic memory device according to a still further modified embodiment of the inventive concepts.

Referring to FIG. 37, a magnetic tunnel junction MTJ may further include at least one of a lower electrode structure 61 disposed below the lower magnetic structure 41 or the upper electrode structure 62 disposed on the upper magnetic structure 42. The lower electrode structure 61 may be disposed between the first interconnection line 10 and the lower magnetic structure 41 or between the selection element 30 and the lower magnetic structure 41, and the upper electrode structure 62 may be disposed between the second interconnection line 20 and the upper magnetic structure 42.

In example embodiments, at least one of the lower and upper electrode structures 61 and 62 may be configured to have a single-layered structure. In other example embodiments, at least one of the lower and upper electrode structures 61 and 62 may be configured to have a multi-layered structure. In addition, the lower and upper electrode structures 61 and 62 may include at least one conductive layer (e.g., of metal). The inventive concepts need not be limited thereto, however. For instance, in other modified example embodiments, a magnetic tunnel junction MTJ may be configured not to include one of the lower and upper electrode structures 61 and 62.

FIGS. 36 and 37 are block diagrams schematically illustrating electronic devices including a semiconductor device according to example embodiments of the inventive concepts.

Figure 38:
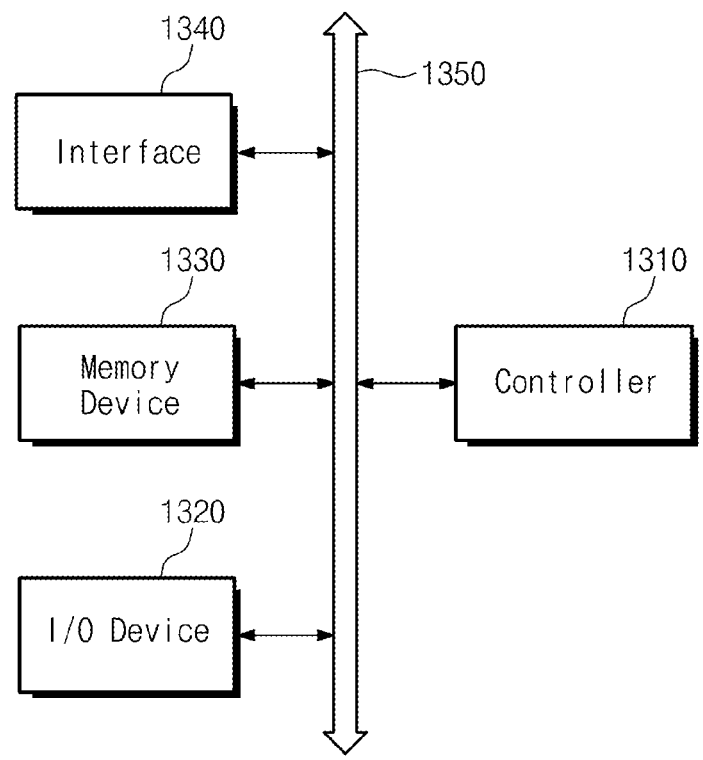
FIGS. 38 and 39 are block diagrams schematically illustrating electronic devices including a semiconductor device according to example embodiments of the inventive concept.

Referring to FIG. 38, an electronic device 1300 including a semiconductor device according to example embodiments of the inventive concept may be used in one of a personal digital assistant (PDA), a laptop computer, a mobile computer, a web tablet, a wireless phone, a cell phone, a digital music player, a wire or wireless electronic device, or a complex electronic device including at least two ones thereof. The electronic device 1300 may include a controller 1310, an input/output device 1320 such as a keypad, a keyboard, a display, a memory 1330, and a wireless interface 1340 that are combined to each other through a bus 1350. The controller 1310 may include, for example, at least one microprocessor, a digital signal process, a microcontroller or the like. The memory 1330 may be configured to store a command code to be used by the controller 1310 or a user data. The memory 1330 may include a semiconductor device according to example embodiments of the inventive concept. The electronic device 1300 may use a wireless interface 1340 configured to transmit data to or receive data from a wireless communication network using a RF signal. The wireless interface 1340 may include, for example, an antenna, a wireless transceiver and so on. The electronic system 1300 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so forth.

Figure 39:
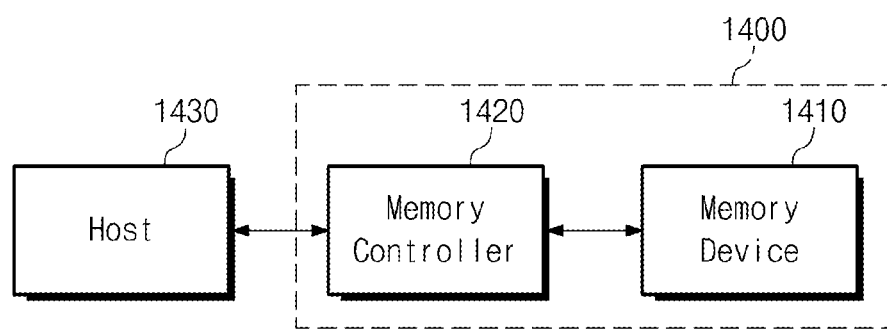

Referring to FIG. 39, a memory system including a semiconductor device according to example embodiments of the inventive concept will be described. The memory system 1400 may include a memory device 1410 for storing large amounts of data and a memory controller 1420. The memory controller 1420 controls the memory device 1410 so as to read data stored in the memory device 1410 or to write data into the memory device 1410 in response to a read/write request of a host 1430. The memory controller 1420 may include an address-mapping table for mapping an address provided from the host 1430 (e.g., a mobile device or a computer system) into a physical address of the memory device 1410. The memory device 1410 may be a semiconductor device according to example embodiments of the inventive concept.

The semiconductor memory devices disclosed above may be encapsulated using various and diverse packaging techniques. For example, the semiconductor memory devices according to the aforementioned example embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

The package in which the semiconductor memory device according to one of the above example embodiments is mounted may further include at least one semiconductor device (e.g., a controller and/or a logic device) that controls the semiconductor memory device.

According to example embodiments of the inventive concept, a lower magnetic structure may be locally formed on a substrate, in advance of etching a tunnel barrier layer. Accordingly, a metallic material in the lower magnetic structure may not be exposed by an etchant for etching the tunnel barrier layer, and this can help prevent the metallic material from being re-deposited on a sidewall of the tunnel barrier. As a result, it is possible to prevent technical problems (for example, an electric short between the upper and lower magnetic structures or degradation in electrical characteristics of the magnetic tunnel junction), which may be caused by the re-deposition of the metallic material.

According to example embodiments of the inventive concept, an upper magnetic structure may be formed on a selected region of the un-etched tunnel barrier layer, and a step of etching the tunnel bather layer may be performed when the upper magnetic structure in the selected region is covered with an insulating material. Accordingly, it may be possible to substantially prevent a metallic material in the upper magnetic structure from being re-deposited on a sidewall of the tunnel barrier.

The principles of the present disclosure may be applied to a variety of other magnetic element or magnetic multilayer structures. A single MTJ or dual MTJ discussed above are, therefore, only some examples of such structures. For example, the principles of the present disclosure may also be applied to any magnetic element having a spin valve as discussed above, e.g., spin valve STT-MRAM having conductive spacer layers formed of a conductive material such as CR, Ta, Ti, W, and Ru, one example of which is shown in U.S. Pat. No. 7,821,088, the contents of which are incorporated herein by reference in their entirety. In addition, the present disclosure can be applied to a ballistic magnetoresistance structure. Also, the principles of the present disclosure may be applied to spin logic devices. The spin logic devices may be, for example, all-spin logic (ASL) device and non-volatile spin logic device, the example of which may be seen in U.S. Provisional Application No. 61/512,163, the entire contents of which are incorporated herein by reference.

In addition, the inventive concept of the present disclosure may be applied to the formation of system-on-chip (SOC) devices requiring a cache. In such cases, the SOC devices may include a MTJ element formed according to the present disclosure coupled to a microprocessor.

The exemplary embodiments are mainly described in terms of particular methods and systems provided in particular implementations. However, the methods and systems will operate effectively in other implementations. Phrases such as "exemplary embodiment", "some embodiments", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments.

In addition, the method and system are described in the context of certain layers being synthetic and/or simple (single). However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used.

The term magnetic may include ferromagnetic, ferrimagnetic or like structures. Thus, the term "magnetic" or "ferromagnetic" includes, but is not limited to ferromagnets and ferrimagnets. The method and system are also described in the context of single magnetic junctions and substructures. However, one of ordinary skill in the art will readily recognize that the method and system are consistent with the use of magnetic memories having multiple magnetic junctions and using multiple substructures.

Various operations may be described as multiple discrete steps performed in a manner that is most helpful in understanding the invention. However, the order in which the steps are described does not imply that the operations are order-dependent or that the order that steps are performed must be the order in which the steps are presented.

It will be understood by those skilled in the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to examples containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. Furthermore, in those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

While example embodiments of the inventive concepts have been particularly shown and described, it will be understood by one of ordinary skill in the art that variations in form and detail may be made therein without departing from the spirit and scope of the attached claims.

The invention claimed is:

1. A magnetic device, comprising:
   a lower electrode;
   a magnetic tunnel junction including a lower magnetic structure, a tunnel barrier, and an upper magnetic structure that are sequentially stacked in a first direction on the top surface of the lower electrode, wherein the tunnel barrier comprises a width that is greater than a width of the lower magnetic structure in a second direction that is substantially perpendicular to the first direction, wherein the tunnel barrier comprises a substantially quadrilateral cross section, and wherein a width of the lower electrode in the second direction is substantially smaller than a width of the lower magnetic structure in the second direction;

an upper electrode stacked in the first direction on the upper magnetic structure;

a capping layer conformally covering the magnetic tunnel junction and comprising single layer, the capping layer including a first portion extending in the first direction and a second portion extending in the second direction; and a mold layer disposed between a sidewall of the lower magnetic structure and the first portion of the capping layer, wherein a width of the upper electrode is smaller than the width of the lower magnetic structure in the second direction, wherein the lower electrode is electrically connected between the lower magnetic structure and a selection element, wherein the upper magnetic structure is electrically connected further away from the selection element than the lower magnetic structure, wherein the first portion of the capping layer is in direct contact with a sidewall of the tunnel barrier and a sidewall of the upper magnetic structure, and wherein the first portion of the capping layer is in directly contact with a sidewall of the mold layer.

2. The device of claim 1, wherein each of the lower and upper magnetic structures has a multi-layered structure including a plurality of layers.

3. The device of claim 2, wherein at least one of the layers of the lower magnetic structure has a generally 'U'-shaped cross section, and wherein at least one of the layers of the upper magnetic structure has a generally 'U'-shaped cross section.

4. The device of claim 1, wherein at least one of the layers of the lower magnetic structure has a generally 'U'-shaped cross section, and each of the layers of the upper magnetic structure has a substantially quadrilateral cross section.

5. The device of claim 1, wherein each of the layers of the lower magnetic structure has a substantially quadrilateral cross section, and wherein at least one of the layers of the upper magnetic structure has a generally 'U'-shaped cross section.

6. The device of claim 1, wherein each of the layers of the lower magnetic structure is a plate-shaped structure having a substantially quadrilateral cross section, and each of the layers of the upper magnetic structure is a plate-shaped structure having a substantially quadrilateral cross section.

7. The device of claim 1, wherein at least one of the layers of the lower magnetic structure comprises sidewall portions facing each other and a bottom portion connecting the sidewall portions, thereby having a generally 'U'-shaped cross section, and the bottom portion is formed of a magnetic material, and the sidewall portions are substantially formed of an oxide of the magnetic material constituting the bottom portion.

8. The device of claim 1, wherein the tunnel barrier has a width greater than that of the upper magnetic structure.

9. The device of claim 1, wherein the tunnel barrier has substantially the same width as that of the upper magnetic structure.

10. The device of claim 1, wherein a lower width of the tunnel barrier is greater than an upper width thereof, and an upper width of the lower magnetic structure is greater than a lower width thereof.

11. The device of claim 1, wherein a lower width of the tunnel barrier is greater than an upper width thereof.

12. The device of claim 11, wherein an upper width of the upper magnetic structure is greater than a lower width thereof.

13. The device of claim 1, wherein a distance between a sidewall of the tunnel barrier and a sidewall of the lower magnetic structure at one side of the tunnel barrier is different than at the other side of the tunnel barrier.

14. The device of claim 13, wherein a distance between sidewalls of the tunnel barrier and the upper magnetic structure is substantially the same at both sides of the tunnel barrier.

15. The device of claim 1, wherein one of the upper and lower magnetic structures comprises an antiferromagnetic material.

16. The device of claim 1, wherein the tunnel barrier comprises a magnesium oxide layer or a pair of magnesium oxide layers separated by a metal-containing layer.

17. A magnetic device, comprising:
a lower electrode;
a magnetic tunnel junction including a lower magnetic structure, a tunnel barrier, and an upper magnetic structure, which are sequentially stacked in a first direction on the lower electrode;
a capping layer on the magnetic tunnel junction, the capping layer being directly in contact with a sidewall of the tunnel barrier and a sidewall of the upper magnetic structure; and
a mold layer disposed between a sidewall of the lower magnetic structure and the capping layer,
wherein the lower electrode is electrically connected between the lower magnetic structure and a selection element,
wherein the upper magnetic structure electrically connected further away from the selection element than the lower magnetic structure,
wherein the tunnel barrier has a width is greater than a width of the lower magnetic structure, in the second direction being substantially perpendicular from the first direction,
wherein a thickness of the capping layer on sidewalls of the tunnel barrier and the upper magnetic structure is substantially uniform, the thickness being measured along the second direction,
wherein the capping layer is spaced apart from the lower magnetic structure, and
wherein the tunnel barrier is in contact with the mold layer.

18. The device of claim 17, wherein a width of the upper magnetic structure is smaller than the width of the tunnel barrier, in the second direction.

19. The device of claim 17, wherein a width of the lower electrode is smaller than a width of the lower magnetic structure, in the second direction.

20. The device of claim 17, further comprising an upper electrode penetrating the capping layer to contact with a top surface of the upper magnetic structure,
wherein the upper electrode has a width smaller than a width of the upper magnetic structure.

21. The device of claim 17, wherein the capping layer extends on a sidewall of the mold layer.

22. The device of claim 17, wherein a sidewall of the mold layer is vertically aligned with the sidewall of the tunnel barrier.

23. The device of claim 1, wherein the capping layer has the lowermost surface located at substantially the same level as a bottom surface of the lower magnetic structure.

* * * * *